(12) United States Patent
Ka et al.

(10) Patent No.: US 10,650,725 B2
(45) Date of Patent: *May 12, 2020

(54) DISPLAY DEVICE

(71) Applicant: SAMSUNG DISPLAY CO., LTD., Yongin-si, Gyeonggi-do (KR)

(72) Inventors: Ji Hyun Ka, Yongin-si (KR); Sun Ja Kwon, Yongin-si (KR); Tae Hoon Kwon, Yongin-si (KR); Byung Sun Kim, Yongin-si (KR); Yang Wan Kim, Yongin-si (KR); Hyun Ae Park, Yongin-si (KR); Su Jin Lee, Yongin-si (KR); Seung Kyu Lee, Yongin-si (KR); Jae Yong Lee, Yongin-si (KR); Jin Tae Jeong, Yongin-si (KR); Seung Ji Cha, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/445,713

(22) Filed: Jun. 19, 2019

(65) Prior Publication Data
US 2019/0304356 A1  Oct. 3, 2019

Related U.S. Application Data

(63) Continuation of application No. 15/434,196, filed on Feb. 16, 2017, now Pat. No. 10,354,578.

(30) Foreign Application Priority Data

Apr. 15, 2016 (KR) .................. 10-2016-0046514
May 25, 2016 (KR) .................. 10-2016-0064127

(51) Int. Cl.
*G09G 5/10* (2006.01)
*G09G 3/20* (2006.01)
(Continued)

(52) U.S. Cl.
CPC .......... *G09G 3/2092* (2013.01); *G02F 1/1333* (2013.01); *G02F 1/13452* (2013.01);
(Continued)

(58) Field of Classification Search
CPC .. G09G 3/2092; G09G 3/3225; G09G 3/3406; G09G 3/20; G09G 3/3233;
(Continued)

(56) References Cited

U.S. PATENT DOCUMENTS 7,579,624 B2  8/2009  Takasugi et al.
8,665,249 B2  3/2014  Suh
(Continued)

FOREIGN PATENT DOCUMENTS

EP   1 063 630 A2   12/2000
EP   2 085 952 A     8/2009
(Continued)

OTHER PUBLICATIONS

Action dated May 17, 2018 for U.S. Appl. No. 15/398,391, filed Jan. 4, 2017.
Action dated May 25, 2018 for U.S. Appl. No. 15/611,297, filed Jun. 1, 2017.
Action dated Jan. 11, 2019 for U.S. Appl. No. 15/712,657 (Yang Wan Kim, et al.).
(Continued)

*Primary Examiner* — Adam R. Giesy
(74) *Attorney, Agent, or Firm* — Kile Park Reed & Houtteman PLLC

(57) ABSTRACT

A display device includes a substrate including a first pixel area, a second pixel area, and a third pixel area, each of the second and third pixel areas having a smaller surface area than the first pixel area and being connected to the first pixel area, first to third pixels provided in the first to third pixel areas, respectively, first to third lines connected to the first to third pixels, respectively, a line connecting part connecting the second and third lines, and a dummy unit overlap-
(Continued)

ping the line connecting part to compensate for a difference of a load value of the first line and a load value of the second line.

20 Claims, 20 Drawing Sheets

(51) Int. Cl.
    *G09G 3/3225*     (2016.01)
    *G09G 3/3233*     (2016.01)
    *G09G 3/34*     (2006.01)
    *H01L 27/32*     (2006.01)
    *G02F 1/1345*     (2006.01)
    *G02F 1/1333*     (2006.01)

(52) U.S. Cl.
    CPC ............. *G09G 3/20* (2013.01); *G09G 3/3225* (2013.01); *G09G 3/3233* (2013.01); *G09G 3/3406* (2013.01); *H01L 27/3223* (2013.01); *G02F 1/13454* (2013.01); *G02F 2001/133388* (2013.01); *G02F 2201/123* (2013.01); *G09G 2300/023* (2013.01); *G09G 2300/0413* (2013.01); *G09G 2300/0426* (2013.01); *G09G 2300/0814* (2013.01); *G09G 2300/0819* (2013.01); *G09G 2300/0842* (2013.01); *G09G 2300/0861* (2013.01); *G09G 2310/0221* (2013.01); *G09G 2310/0281* (2013.01); *G09G 2320/0223* (2013.01); *G09G 2320/0233* (2013.01); *G09G 2330/04* (2013.01); *H01L 27/3276* (2013.01)

(58) Field of Classification Search
    CPC ... G09G 2320/0233; G09G 2320/0223; G09G 2310/0281; G09G 2310/0221; G09G 2300/023; G09G 2300/0426; G09G 2300/0814; G09G 2300/0819; G09G 2300/0842; G09G 2300/0861; G09G 2300/0413; G09G 2330/04; H01L 27/3223; H01L 27/3276
    See application file for complete search history.

(56) References Cited

U.S. PATENT DOCUMENTS

| | | |
|---|---|---|
| 2004/0125258 A1 | 7/2004 | Moon et al. |
| 2006/0244387 A1 | 11/2006 | Park et al. |
| 2007/0080433 A1 | 4/2007 | Lai |
| 2008/0218450 A1 | 9/2008 | Park |
| 2009/0102758 A1 | 4/2009 | Anzai et al. |
| 2009/0102824 A1 | 4/2009 | Tanaka et al. |
| 2009/0303404 A1 | 12/2009 | Kretz |
| 2010/0020059 A1 | 1/2010 | Suh |
| 2010/0073335 A1 | 3/2010 | Min et al. |
| 2010/0177024 A1 | 7/2010 | Choi |
| 2011/0084955 A1 | 4/2011 | Kim |
| 2013/0106817 A1 | 5/2013 | Gang et al. |
| 2015/0022513 A1 | 1/2015 | Kim |
| 2015/0325593 A1 | 11/2015 | Shih et al. |
| 2016/0019856 A1 | 1/2016 | Tanaka et al. |

FOREIGN PATENT DOCUMENTS

| | | |
|---|---|---|
| KR | 10-0672792 B1 | 1/2007 |
| KR | 10-2008-0060886 A | 7/2008 |
| KR | 10-1064425 B1 | 9/2011 |
| KR | 10-1101070 B1 | 12/2011 |
| KR | 10-1376654 B1 | 3/2014 |
| KR | 10-1416529 B1 | 7/2014 |
| KR | 10-1432126 B1 | 8/2014 |
| WO | WO 2007/069187 A2 | 6/2007 |

OTHER PUBLICATIONS

Extended EP Search Report dated Jul. 14, 2017 in European Patent Application No. 17158534.2.
EP Partial Search Report dated Oct. 25, 2017, for corresponding EP Application No. 17178307.9.
Partial EP Search Report dated Dec. 14, 2017 for EP Application No. 17192551.4 (Search Completion Date: Nov. 2, 2017).
Extended EP Search Report dated Mar. 14, 2018, for corresponding EP Application No. 17178307.9.
Extended EP Search Report dated Jul. 7, 2017 for EP Application No. 17166354.5 filed on Apr. 12, 2017.
Action dated Jun. 3, 2019 for EP Patent Application No. 17166354.5 filed on Apr. 12, 2017.
Partial EP Search Report dated Dec. 17, 2017 (EP 17 19 2551).
Extended EP Search Report dated Mar. 21, 2019 (EP 17 19 2551).

DISPLAY DEVICE

CROSS-REFERENCE TO RELATED APPLICATIONS

This is a continuation application based on pending application Ser. No. 15/434,196, filed Feb. 16, 2017, the entire contents of which is hereby incorporated by reference.

Korean Patent Application Nos. 10-2016-0046514, filed on Apr. 15, 2016, and 10-2016-0064127, filed on May 25, 2016, in the Korean Intellectual Property Office, and entitled: "Display Device," are incorporated by reference herein in its entirety.

BACKGROUND

1. Field

Embodiments of the present disclosure relate to a display device, and more particularly, to a display device that includes areas having different surface areas from each other.

2. Description of the Related Art

The display device includes a plurality of pixels including a display element, each pixel provided with wires and a plurality of transistors connected to the wires and configured to drive the display element. The wires may have different load values depending on their lengths, and due to such differences in the load values, a difference of brightness may occur in a final image provided by the display device.

SUMMARY

According to an embodiment of the present disclosure, there is provided a display device including a substrate including a first pixel area, and a second pixel area and a third pixel area having smaller surface areas than the first pixel area and that are connected to the first pixel area; a first to third pixels each provided in the first to third pixel areas, respectively; a first to third lines each connected to the first to third pixels; line connecting parts connecting the second line and the third line; and a dummy unit overlapped with the line connecting parts, and configured to compensate for a difference of a load value of the first line and a load value of the second line. The first line may be longer than the second line and the third line.

In the embodiment of the present disclosure, the display device may further include a data line for providing a data signal to the first to third pixels, and the first line may be a first scan line for providing a scan signal to the first pixel, and the second line and the third line may be a second scan line and a third scan line for providing a scan signal to the second pixel and the third pixel.

In the embodiment of the present disclosure, the substrate may further include a first to third peripheral areas each surrounding the first to third pixel areas, respectively, and the dummy unit may be provided in at least an additional peripheral area among the second peripheral area, the third peripheral area, and the additional peripheral area connecting the second peripheral area and the third peripheral area.

In the embodiment of the present disclosure, each of the second pixel and the third pixel may include a transistor that is connected to the second scan line and the third scan line and a corresponding data line among the data lines, and the transistor may include an active pattern provided on the substrate; the gate electrode provided on the active pattern; a gate insulating film disposed between the active pattern and the gate electrode; an interlayer insulating film including a first interlayer insulating film covering the gate electrode and a second interlayer insulating film arranged on the first interlayer insulating film; and a source electrode and a drain electrode arranged on the interlayer insulating film and each of which is connected to the active pattern.

In the embodiment of the present disclosure, the display device may further include a power source supply line that is arranged in the first peripheral area, the second peripheral area, the third peripheral area and the additional peripheral area on the interlayer insulating film, and the power source supply line is overlapped with the line connecting parts, and the line connecting part may be arranged between the first interlayer insulating film and the second interlayer insulating film.

In the embodiment of the present disclosure, the dummy unit may include an auxiliary power source supply pattern connected to the power source supply line, and arranged between the first interlayer insulating film and the second interlayer insulating film, and the line connecting part may be arranged between the gate insulating film and the first interlayer insulating film.

In the embodiment of the present disclosure, the display device may further include a power source supply line that is arranged in the first peripheral area, the second peripheral area, the third peripheral area and the additional peripheral area, and is arranged on the interlayer insulating film, and is overlapped with the line connecting parts, and the dummy pattern may be applied with a same voltage as the power source supply line.

In the embodiment of the present disclosure, the display device may further include data lines for providing a data signal to the first to third pixels, and a first to third scan lines for providing a scan signal to the first to third pixels, and the first line may be a first light emission control signal line providing a light emitting control signal to the first pixel, and the second line and the third line may be a second light emission control line and a third light emission control line providing a light emitting control signal to the second pixel and the third pixel.

In the embodiment of the present disclosure, the second pixel area and the third pixel area may include a plurality of rows where a plurality of pixels area arranged, and each line connecting part may connect the second line and the third line that connect the pixels arranged in a same row.

In the embodiment of the present disclosure, a length of the line connecting part (hereinafter referred to as a first line connecting part) that connects the second line and the third line having less number of pixels arranged in the row of the line connecting parts may be greater than a length of the line connecting part (hereinafter referred to as a second line connecting part) that connects the second line and the third line having more number of pixels arranged in the row.

In the embodiment of the present disclosure, a surface area of superimposition of the first line connecting part and the dummy pattern may be greater than a surface area of superimposition of the second line connecting part and the dummy pattern.

In the embodiment of the present disclosure, at least one of the dummy pattern and the power source supply line may include a plurality of open areas that are overlapped with the line connecting part and are spaced apart from one another.

In the embodiment of the present disclosure, based on a central line of the first pixel area, the second pixel area and the second peripheral area may have shapes that are line symmetrical to the third pixel area and the third peripheral area based on the central line of the first pixel area.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
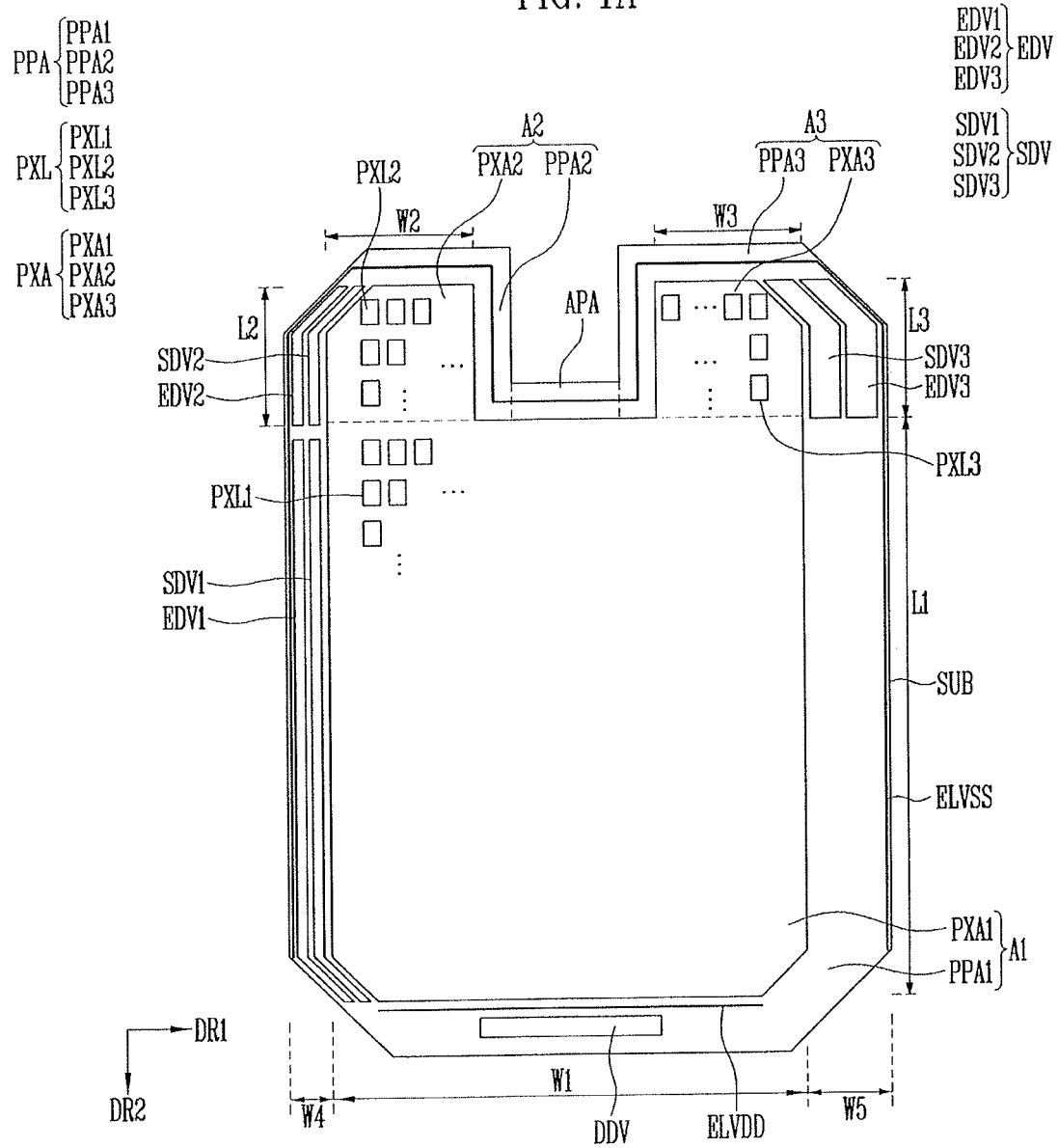
FIG. 1A and FIG. 1B illustrate plan views of a display device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Terms such as "a first", "a second" may be used to explain various configurative elements, but the configurative elements should not be limited by the aforementioned terms. These terms are used only for the purpose of differentiating one configurative element from another. For example, without departing from the scope of the present disclosure, a first configurative element may be called a second configurative element, and likewise, the second configurative element may be called the first configurative element. A singular expression may include a plural expression unless clearly meant otherwise in the context.

In the present application, it should be understood that terms such as "comprise" or "have" and so on are used to designate existence of a feature, a number, a step, an operation, a configurative element, a component or a combination thereof disclosed in the specification, and not to pre-exclude existence or possibility of adding one or more other features, numbers, steps, operations, configurative elements, components or combinations thereof. Further, in the present specification, when a part such as a layer, a film, an area, a plate and so on are formed on another part, the formed direction is not limited to an upper direction, but a side and a lower direction may also be included.

Hereinafter, preferred embodiments of the present disclosure will be explained in further detail with reference to the drawings attached.

Figure 1B:
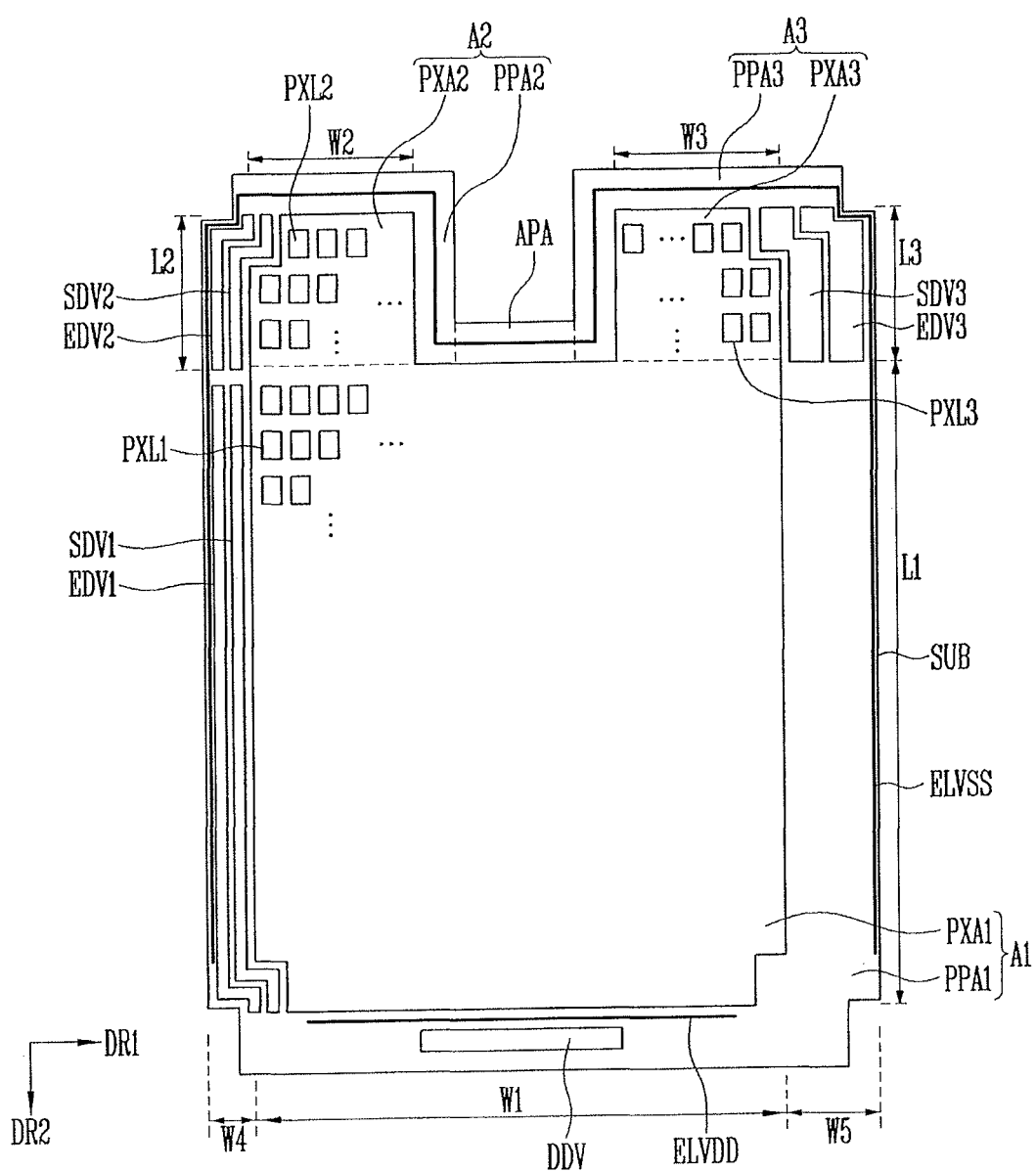
Figure 2:
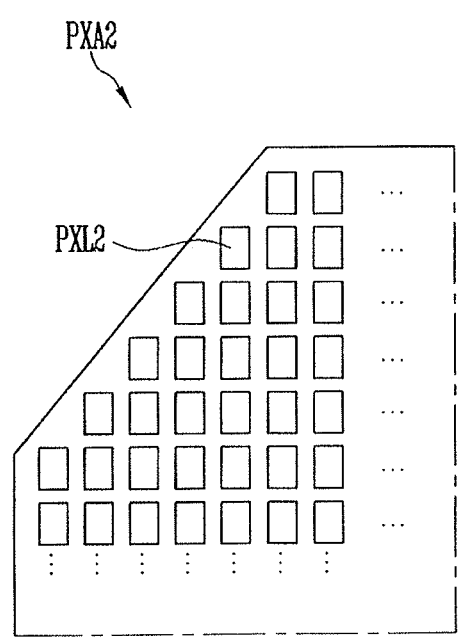
FIG. 2 illustrates an enlarged view of a second pixel area of FIG. 1A.

FIG. 1A and FIG. 1B are plan views illustrating a display device according to embodiments of the present disclosure, and FIG. 2 is an enlarged view of a second pixel area of FIG. 1A.

Referring to FIG. 1A, FIG. 1B, and FIG. 2, a display device according to embodiments of the present disclosure may include a substrate SUB, a plurality of pixels PXL, e.g., pixels PXL1, PXL2, PXL3, provided on the substrate SUB, a driver provided on the substrate SUB and configured to drive the pixels PXL, a power source supply part configured to supply power source to the pixels, and a wire part connecting the pixels PXL and the driver.

The substrate SUB includes a plurality of areas, and at least two of these areas may have surface areas that are different from each other. For example, the substrate SUB may have two areas, and these two areas may have surface areas that are different from each other. In another example, the substrate SUB may have three areas, and these three areas may have surface areas that are different from one another, or only two of these three areas may have surface areas that are different from each other. In yet another example, the substrate SUB may have four or more areas.

In the embodiments hereinafter, for convenience of explanation, a substrate SUB including three areas, i.e., first to third areas A1, A2, A3, is described as an example. Each of the first to third areas A1, A2, A3 may have various shapes.

For example, each of the first to third areas A1, A2, A3 may be provided in various shapes, e.g., a closed polygonal form that includes straight sides, a circular or an elliptical form that includes a side made of a curve, a semi-circular or a semi-elliptical form and so on that includes a side made of a straight line and a side made of a curve, etc.

For example, each of the first to third areas A1, A2, A3 may have a generally rectangular shape, and may have a shape in which an area adjacent to at least one vertex among the vertexes of the rectangular shape is removed. For example, as illustrated in FIG. 1A, the second area A2 (top left of the layout in FIG. 1A) may have a generally rectangular shape with a removed triangular corner (top left corner in FIG. 1A). In another example, as illustrated in FIG. 1B, the second area A2 (top left of the layout in FIG. 1B) may have a generally rectangular shape with a removed quadrangular corner (top left corner in FIG. 1B). The first to third areas A1, A2, A3 may be differentiated into a first sub area corresponding to the removed area and a second sub area other than the first sub area. Here, a width of the first sub area may be greater than a width of the second sub area.

The shape of the area adjacent to at least one of the vertexes of the rectangular shape and removed therefrom may be one of a triangular shape and a rectangular shape. For example, as illustrated in FIG. 1A, a side corresponding to the removed area of the first to third areas A1, A2, A3 may have a diagonal shape that is inclined against one side of the rectangular shape or a bent segment line shape.

Each of the first to third areas A1, A2, A3 may have pixel areas PXA1, PXA2, PXA3 (hereinafter referred to as PXA), and peripheral areas PPA1, PPA2, PPA3 (hereinafter referred to as PPA). The pixel areas PXA are areas where pixels PXL for displaying images are provided. Explanation on each pixel PXL will be made later on. In an embodiment of the present disclosure, each of the first to third pixel areas PXA1, PXA2, PXA3 may generally have a shape corresponding to the shape of the first to third areas A1, A2, A3, respectively, e.g., the pixel areas PXA2 may have a rectangular shape with a removed corner corresponding to and overlapping the removed corner of its corresponding area A2.

The peripheral areas PPA are areas where the pixels PXL are not provided, and thus where an image is not displayed. In the peripheral areas PPA, a driver for driving the pixels PXL, the power source supply part for applying power source to the pixels PXL, and a portion of a wire (not illustrated) for connecting the pixels PXL and the driver may be provided. The peripheral areas PPA correspond to a bezel in a final display device, and a width of the bezel may be determined according to a width of the peripheral area.

Explanation of each of the first to third areas A1, A2, A3 is as follows. The first area A1 may have the greatest surface area among the first to third areas A1, A2, A3. The first area A1 may have a first pixel area PXA1, i.e., where images are displayed, and a first peripheral area PPA1 that surrounds at least a portion of the first pixel area PXA1.

The first pixel area PXA1 may be provided in a shape corresponding to the shape of the first area A1. In an embodiment of the present disclosure, the first pixel area PXA1 may have a first width W1 in a first direction DR1, and a first length L1 in a second direction DR2 that intersects with the first direction DR1.

The first peripheral area PPA1 may be provided at least at one side of the first pixel area PXA1. In an embodiment of the present disclosure, the first peripheral area PPA1 may surround a circumference of the first pixel area PXA1, but may be provided in the area excluding the portion where the second area A2 and the third area A3 are arranged. In an embodiment of the present disclosure, the first peripheral area PPA1 may include a breadth part extending in a width direction, and a length part extending in a longitudinal direction. The length part of the first peripheral area PPA1 may be provided in one pair that are spaced apart from each other along the width direction of the first pixel area PXA1.

The second area A2 may have a smaller surface area than the first area A1. The second area A2 may have a second pixel area PXA2, i.e., where images are displayed, and a second peripheral area PPA2 that surrounds at least a portion of the second pixel area PXA2.

The second pixel area PXA2 may be provided in a shape corresponding to the shape of the second area A2. In an embodiment of the present disclosure, the second pixel area PXA2 may have a second width W2 that is smaller than the first width W1 of the first area A1. The second pixel area PXA2 may have a second length L2 that is smaller than the first length L1 of the first area A1. The second pixel area PXA2 may be provided in a form protruding from the first pixel area PXA1, and may be directly connected to the first pixel area PXA1. In other words, in the second pixel area PXA2, an edge portion that is closest to the first pixel area PXA1 may coincide with the edge of the first pixel area PXA1.

The second peripheral area PPA2 may be provided at least at one side of the second pixel area PXA2. In an embodiment of the present disclosure, the second peripheral area PPA2 may surround the second pixel area PXA2, but may not be provided in a portion where the first pixel area PXA1 and the second pixel area PXA2 are connected to each other. In an embodiment of the present disclosure, the second peripheral area PPA2 may also include a breadth part extending in the width direction, and a length part extending in the longitudinal direction. The length part of the second peripheral area PPA2 may be provided in one pair spaced apart from each other along the width direction of the second pixel area PXA2.

The third area A3 may have a smaller surface area than the first area A1. The third area A3 may have a same surface area as the second area A2. The third area A3 may have a third pixel area PXA3, i.e., where images are displayed, and a third peripheral area PPA3 that surrounds at least a portion of the third pixel area PXA3.

The third pixel area PXA3 may be provided in a shape corresponding to the shape of the third area A3. In an embodiment of the present disclosure, the third pixel area PXA3 may have a third width W3 that is smaller than the first width W1 of the first area A1. The third pixel area PXA3 may have a third length L3 that is smaller than the first length L1 of the first area A1. The second width W2 and the third width W3 may be identical to each other. Further, the second length L2 and the third length L3 may be identical to each other.

The third pixel area PXA3 may be provided in a form protruding from the first pixel area PXA1, and may be directly connected to the first pixel area PXA1. In other words, in the third pixel area PXA3, the edge portion that is closest to the first pixel area PXA1 may coincide with the edge of the first pixel area PXA1.

The third peripheral area PPA3 may be provided at least at one side of the third pixel area PXA3. In an embodiment of the present disclosure, the third peripheral area PPA3 may surround the third pixel area PXA3, but may not be provided in a portion where the first pixel area PXA1 and the third pixel area PXA3 are connected to each other. In an embodiment of the present disclosure, the third peripheral area PPA3 may also include a breadth part extending in the width direction and a length part extending in the longitudinal direction. The length part of the third peripheral area PPA3 may also be provided in one pair spaced apart from each other along the width direction of the first pixel area PXA1.

In an embodiment of the present disclosure, based on an imaginary central line through the first area A1, the third area A3 may have a shape that is line symmetrical with respect to the second area A2. As such, an arrangement relationship of each configurative element provided in the third area A3 may be substantially the same as in the second area A2 except for some wires.

Further, the substrate SUB may have a shape where the second area A2 and the third area A3 protrude in the second direction D2 relative to the first area A1. Further, since the second area A2 and the third area A3 are arranged such that they are spaced apart from each other in the first direction DR1, the substrate SUB may have a shape where the space between the second area A2 and the third area A3 is dented, e.g., a portion of the substrate SUB between the second and third areas A2 and A3 may be removed to define an indentation. That is, the substrate SUB may be provided with a notch between the second area A2 and the third area A3.

In an embodiment of the present disclosure, length parts of the first peripheral area PPA1 may each be connected to a portion of the length parts of the second peripheral area PPA2 and the third peripheral area PPA3. For example, a left length part of the first peripheral area PPA1 and a left length part of the second peripheral area PPA2 may be connected to each other. A right length part of the first peripheral area PPA1 and a right length part of the third peripheral area PPA3 may be connected to each other. Further, the left length part of the first peripheral area PPA1 and the left length part of the second peripheral area PPA2 may have a same width W4. The right length part of the first peripheral area PPA1 and the right length part of the third peripheral area PPA3 may have a same width W5.

The width W4 of the left length part of the first peripheral area PPA1 and the second peripheral area PPA2 may be different from the width W5 of the right length part of the first peripheral area PPA1 and the third peripheral area PPA3. For example, the width W4 of the left length part of the first peripheral area PPA1 and the second peripheral area PPA2 may be smaller than the width W5 of the right length part of the first peripheral area PPA1 and the third peripheral area PPA3.

In an embodiment of the present disclosure, the second peripheral area PPA2 and the third peripheral area PPA3 may be connected by an additional peripheral area APA. For example, the additional peripheral area APA may connect the right length part of the second peripheral area PPA2 and the left length part of the third peripheral area PPA3. That is, the additional peripheral area APA may be provided on a side of the first pixel area PXA1 between the second area A2 and the third area A3.

The pixels PXL may be provided in the pixel areas PXA on the substrate SUB, i.e., in the first to third pixel areas PXA1, PXA2, PXA3. Each pixel PXL is a minimum unit for displaying an image, and may be provided in the plural. The pixels PXL may include display elements that emit a color light. For example, the display element may be any one of a liquid crystal display (LCD) device, an electrophoretic display (EPD) device, an electrowetting display (EWD) device and an organic light emitting diode (OLED) device. Meanwhile, hereinafter, for convenience, the organic light emitting display device is explained as an example of the display element.

Each pixel PXL may emit one color among red, green and blue, but there is no limitation thereto. For example, each pixel PXL may emit a color such as cyan, magenta, yellow and white, etc.

The pixels PXL may include first pixels PXL1 arranged in the first pixel area PXA1, second pixels PXL2 arranged in the second pixel area PXA2, and third pixels PXL3 arranged in the third pixel area PXA3. In an embodiment of the preset disclosure, the first to third pixels PXL1, PXL2, PXL3 may each be provided in the plural, and be arranged in a matrix form along a row extending in the first direction DR1 and along a column extending in the second direction DR2. However, there is no particular limitation to the arrangement form of the first to third pixels PXL1, PXL2, and PXL3, and thus, the first to third pixels PXL1, PXL2, and PXL3 may be arranged in various forms. For example, the first pixels PXL1 may be arranged such that the first direction DR1 is a line direction, but the second pixels PXL2 may be arranged such that a direction other than the first direction DR1, e.g., a direction that is inclined (e.g., at an oblique angle) against the first direction DR1, is the line direction. Further, the third pixels PXL3 may be arranged in a same direction to or in a different direction from the first pixels PXL1 and/or the second pixels PXL2 Otherwise, in another embodiment of the present disclosure, the row direction may be the second direction DR2 and the column direction may be the first direction DR1.

Meanwhile, in the second area A2 and the third area A3, the number of the second pixels PXL2 and the third pixels PXL3 may differ depending on the row. For example, in the second area A2 and the third area A3, the number of the second pixels PXL2 and the third pixels PXL3 arranged in a row corresponding to a corner consisting of a side of a diagonal line having the inclination may be smaller than the number of the second pixels PXL2 and the third pixels PXL3 arranged in a row corresponding to a corner consisting of a side of a straight line. For example, as illustrated in FIG. 2, the number of the second pixels PXL2 and the third pixels PXL3 arranged in a row adjacent to, e.g., aligned with at least a portion of, the missing corner of the rectangular shape of the second and third areas A2 and A3 may be smaller than the number of the second pixels PXL2 and the third pixels PXL3 arranged in a row between two parallel sides of the rectangular shape of the second and third areas A2 and A3. Further, the number of the second pixels PXL2 and the third pixels PXL3 arranged in the row may decrease as the length of the row becomes shorter. Therefore, the length of the wire connecting the second pixels PXL2 and the third pixels PXL3 may become shorter.

Further, in the second area A2 and in the third area A3, a scan line or a light emission control line of the second pixels PXL2 and the third pixels PXL3 corresponding to the same row may be electrically connected by a scan line connecting part or a light emission control line connecting part. The driver may provide a signal to each pixel through the wire part, and control operation of the each pixel PXL accordingly. In FIG. 1A and FIG. 1B, the wire part is omitted for convenience of explanation, and the wire part will be explained in more detail later on.

The driver may include scan drivers SDV1, SDV2, SDV3 (hereinafter referred to as SDV) that provide a scan signal to each pixel along a scan line, light emission drivers EDV1, EDV2, EDV3 (hereinafter referred to as EDV) that provide a light emission control signal to each pixel along a light emission control line, a data driver DDV that provides a data signal to each pixel along a data line, and a timing control unit (not illustrated). The timing control unit may control the scan driver SDV, the light emission driver EDV, and the data driver DDV.

In an embodiment of the present disclosure, the scan drivers SDV may include a first scan driver SDV1 connected to the first pixels PXL1, a second scan driver SDV2 connected to the second pixels PXL2, and a third scan driver SDV3 connected to the third pixels PXL3. In an embodiment of the present disclosure, the light emission drivers EDV may include a first light emission driver EDV1 connected to the first pixels PXL1, a second light emission driver SDV2 connected to the second pixels PXL2, and a third light emission driver EDV3 connected to the third pixel PXL3.

The first scan driver SDV1 may be arranged in the length part of the first peripheral area PPA1, e.g., the first scan driver SDV1 may extend continuously along a linear side of the first area A1 along the second direction DR2 and along a portion of a diagonal direction with respect to the second direction DR2 that defines the missing corner of the first area A1 (FIG. 1A). The length part of the first peripheral area PPA1 is provided in one pair spaced apart from each other along the width direction of the first pixel area PXA1, and thus, the first scan driver SDV1 may be arranged at least at one side of the length part of the first peripheral area PPA1. The first scan driver SDV1 may extend at length along the longitudinal direction of the first peripheral area PPA1. In a similar method thereto, the second scan driver SDV2 may be arranged in the second peripheral area PPA2, and the third scan driver SDV3 may be arranged in the third peripheral area PPA3.

In an embodiment of the present disclosure, the light emission drivers EDV may be directly mounted on the substrate SUB. In the case where the light emission drivers EDV are directly mounted on the substrate SUB, they may be formed together during a process where the pixels PXL are formed. However, there is no limitation to the location or method of provision of the light emission drivers EDV. For example, the light emission drivers EDV may be formed on a separate chip and provided on the substrate SUB in a chip-on-glass form, or may be mounted onto a printed circuit board and connected to the substrate SUB by a connecting member.

The first light emission driver EDV1 may also be arranged in the length part among the first peripheral area PPA1 in a similar manner to the first scan driver SDV1, e.g., the first light emission driver EDV1 may extend in parallel to the first scan driver SDV1. The first light emission driver EDV1 may be arranged in at least one side of the length part of the first peripheral area PPA1. The first light emission driver EDV1 may extend at length along the longitudinal direction of the first peripheral area PPA1. In a similar manner as aforementioned, the second light emission driver EDV2 may be arranged in the second peripheral area PPA2, and the third light emission driver EDV3 may be arranged in the third peripheral area PPA3.

In an embodiment of the present disclosure, it is illustrated as an example that the scan drivers SDV and the light emission drivers EDV are adjacent to each other, and are formed only at one side of the pairs of length parts of the peripheral areas PPA, but there is no limitation thereto. The arrangement of the scan drivers SDV and the light emission drivers EDV may vary. For example, the first scan driver SDV1 may be provided at one side of the length parts of the first peripheral area PPA1, and the first light emission driver EDV1 may be provided at another side of the length part of the first peripheral area PPA1. Otherwise, the first scan driver SDV1 may be provided at both sides of the length part of the first peripheral area PPA1, and the first light emission driver EDV1 may be provided at only one side of the length part of the first peripheral area PPA1.

The data driver DDV may be arranged in the first peripheral area PPA1. Especially, the data driver DDV may be arranged in a breadth part of the first peripheral area PPA1. The data driver DDV may extend at length along the width direction of the first peripheral area PPA1, e.g., along the first direction DR1. In an embodiment of the present disclosure, the scan drivers SDV, the light emission drivers EDV, and/or the data driver DDV may exchange places with each other.

The timing control unit may be connected to the first to third scan drivers SDV1, SDV2, SDV3, the first to third light emission drivers EDV1, EDV2, EDV3, and the data driver DDV by wires in various methods, and there is no particular limitation to the position of arrangement. For example, the timing control unit may be mounted onto the print circuit board, and may be connected to the first to third scan drivers SDV1, SDV2, SDV3, the first to third light emission drivers EDV1, EDV2, EDV3, and the data driver DDV, and the print circuit board may be arranged in various positions such as at one side of the substrate and on a rear surface of the substrate, etc.

Further, in a configuration where the scan line or the light emission control line of the second pixels PXL2 and the third pixels PXL3 corresponding to the same row is electrically connected by the scan line connecting part or the light emission control line connecting part, one of the second and third scan drivers SDV2, SDV3 and one of the second and third light emission drivers EDV2, EDV3 may be omitted.

The power source supply part may include at least one power source supply line ELVDD, ELVSS. For example, the power source supply part may include a first power source supply line ELVDD and a second power source supply line ELVSS. The first power source supply line ELVDD and the second power source supply line ELVSS may supply power source to the first pixel PXL1, the second pixel PXL2, and the third pixel PXL3.

One of the first power source supply line ELVDD and the second power source supply line ELVSS, e.g., the first power source supply line ELVDD, may be arranged to correspond to one side of the first pixel area PXA1. For example, the first power source supply line ELVDD may be arranged in the area where the data driver DDV of the first peripheral area PPA1 is arranged. Further, the first power source supply line ELVDD may extend in the width direction of the first pixel area PXA1.

The other one of the first power source supply line ELVDD and the second power source supply line ELVSS, e.g., the second power source supply line ELVSS, may be arranged to surround the first pixel area PXA1, the second pixel area PXA2, and the third pixel area PXA3 excluding the area where the data driver DDV of the first peripheral area PPA1 is arranged. For example, the second power source supply line ELVSS may have a shape extending along the left length part of the first peripheral area PPA1, and the second peripheral area PPA2, the third peripheral area PPA3, the additional peripheral area APA, and the right length part of the first peripheral area PPA1.

Hereinabove, it was explained as an example that the first power source supply line ELVDD is arranged to correspond to one side of the first pixel area PXA1 among the first peripheral area PPA1, and it was explained that the second power source supply line ELVSS is arranged in the remaining peripheral areas, but there is no limitation thereto. For example, the first power source supply line ELVDD and the second power source supply line ELVSS may be arranged to surround the first pixel area PXA1, the second pixel area PXA2, and the third pixel area PXA3. The voltage being applied to the first power source supply line ELVDD may be greater than the voltage being applied to the second power source supply line ELVSS.

Figure 3:
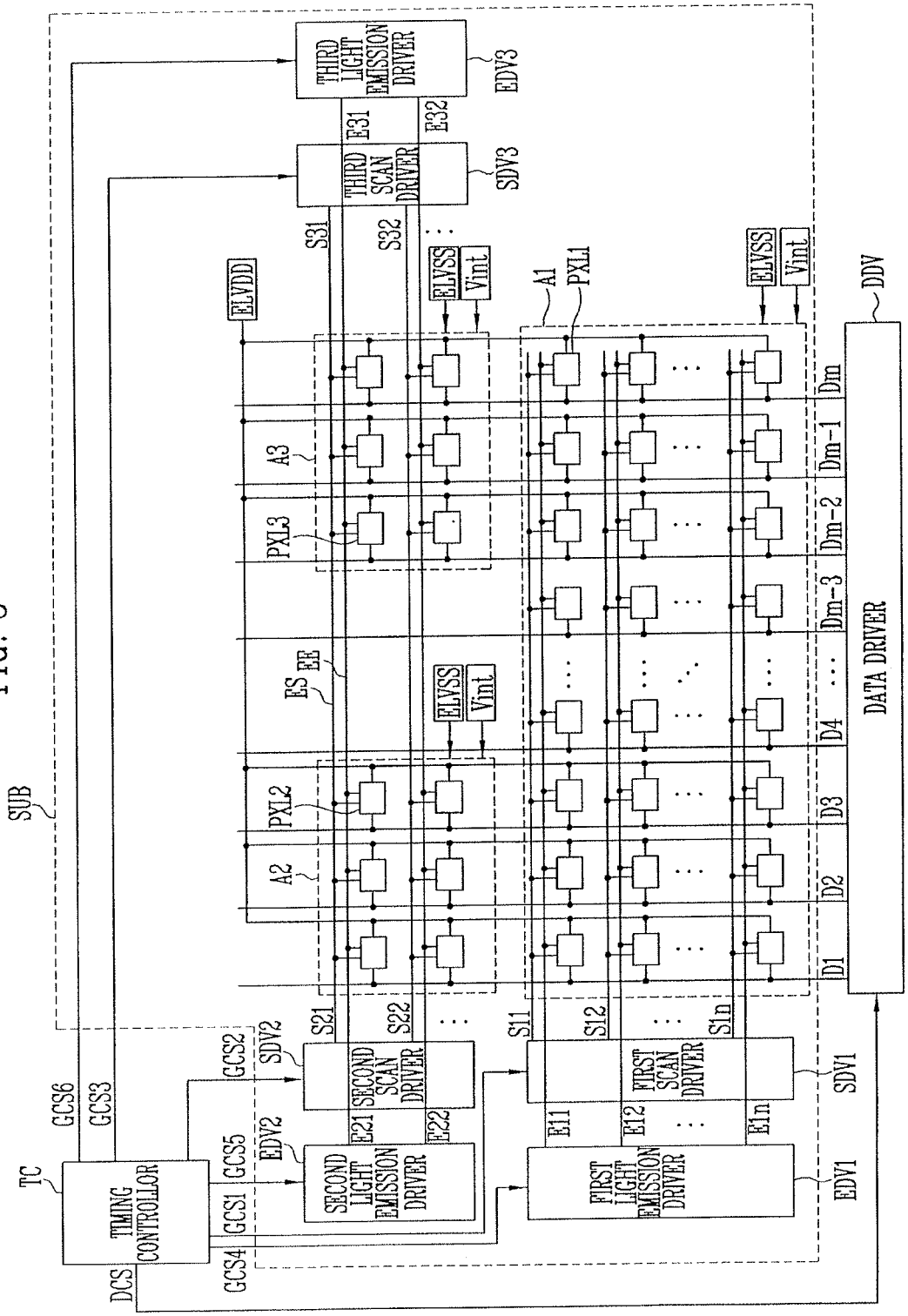
FIG. 3 and FIG. 4 illustrate block diagrams of pixels according to an embodiment of the present disclosure and an embodiment of a driver.
Figure 4:
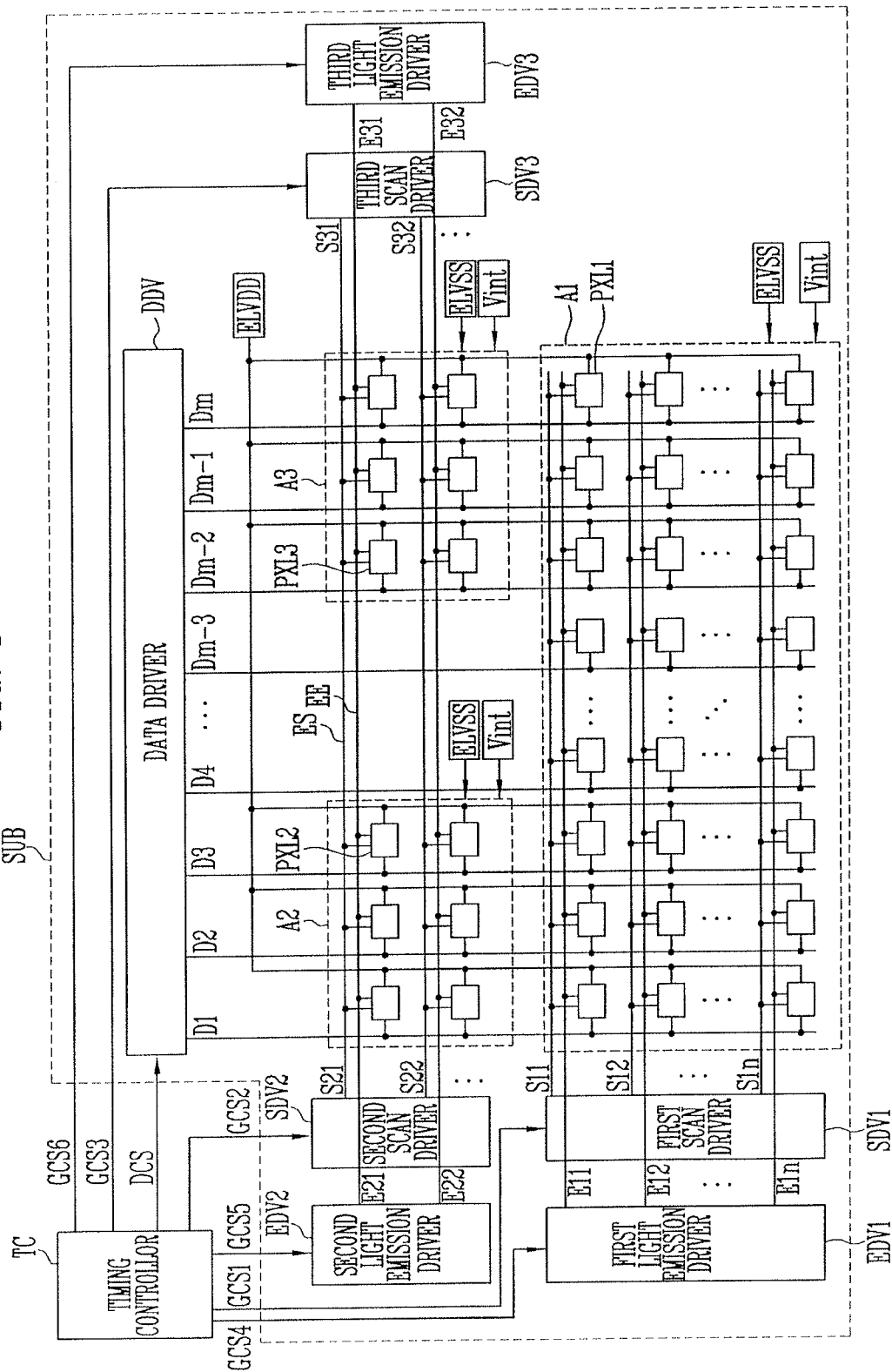

FIGS. 3 and 4 are block diagrams illustrating pixels according to an embodiment of the present disclosure, and an embodiment of the driver.

Referring to FIGS. 1A, 1B, and 2 to 4, the display device according to the embodiment of the present disclosure includes pixels PXL, a driver, and a wire part.

The pixels PXL include the first to third pixels PXL1, PXL2, PXL3, and the driver includes the first to third scan drivers SDV1, SDV2, SDV3, the first to third light emission drivers EDV1, EDV2, EDV3, the data driver DDV, and a timing control unit TC. In FIG. 3, the positions of the first to third scan drivers SDV1, SDV2, SDV3, the first to third light emission drivers EDV1, EDV2, EDV3, the data driver DDV, and the timing control unit TC are for convenience sake, and thus, when actually realizing the display device, they may be arranged in different positions inside the display device. For example, the data driver DDV is arranged closer to the first area A1 than to the second area A2 and the third area A3, but there is no limitation thereto. For example, the data driver DDV may be arranged to be adjacent to the second area A2 and the third area A3 as illustrated in FIG. 4.

The wire part provides a signal of the driver to each pixel PXL, and includes scan lines, data lines, line connecting parts ES, EE, light emission control lines, a power source line and an initializing power source line. The scan lines include a first to third scan lines S11 to S1n, S21 and S22, S31 and S32, each of which is connected to the first to third pixels PXL1, PXL2, PXL3, respectively, and the light emission control lines include a first to third light emission control lines E11 to E1n, E21 and E22, E31 and E32, each of which is connected to the first to third pixels PXL1, PXL2, PXL3, respectively. The data lines D1 to Dm and the power source line are connected to the first to third pixels PXL1, PXL2, PXL3.

Additionally, the second scan lines S21 and S22 and the third scan lines S31 and S32 are electrically accessed by the scan line connecting parts ES. For example, the second scan line S21 is electrically accessed to the third scan line S31 by the first scan line connecting part ES. Further, the second scan line S22 is electrically accessed to the third scan line S32 by the second scan line connecting part ES.

Further, the second light emission control lines E21 and E22 and the third light emission control lines E31 and E32 are electrically accessed by the light emission control line connecting parts EE. For example, the second light emission control line E21 is electrically accessed to the third light emission control line E31 by the first light emission control line connecting part EE. Further, the second light emission control line E22 is electrically accessed to the third light emission control line E32 by the second light emission control line connecting part EE.

The first pixels PXL1 are disposed in the first pixel area PXA1. The first pixels PXL1 are connected to the first scan lines S11 to S1n, the first light emission control lines E11 to E1n, and the data lines D1 to Dm. These first pixels PXL1 are provided with a data signal from the data lines D1 to Dm when a scan signal is supplied from the first scan lines S11 to S1n. The first pixels PXL1 that received the data signal control the amount of current flowing from the first power source ELVDD to the second power source ELVSS via the organic light emitting diode.

The second pixels PXL2 are disposed in the second pixel area PXA2. The second pixels PXL2 are connected to the second scan lines S21, S22, the second light emission control lines E21, E22, and the data lines D1 to D3. Such second pixels PXL2 are provided with a data signal from the data lines D1 to D3 when a scan signal is supplied from the second scan lines S21, S22 and the third scan lines S31, S32. The second pixels PXL2 that received the data signal control the amount of current flowing from the first power source ELVDD to the second power source ELVSS via the organic light emitting diode.

Additionally, although it is illustrated in FIG. 3 that six second pixels PXL2 are disposed in the second pixel area PXA2 by two second scan lines S21, S22, two second light emission control lines E21, E22, and three data lines D1 to D3, there is no limitation thereto. That is, a plurality of second pixels PXL2 are arranged to correspond to the size of the second pixel area PXA2, and the number of the second scan lines, the second light emission control lines, and data lines may be set variously to correspond to the second pixels PXL2.

The third pixels PXL3 are disposed in the third pixel area PXA3 divided by the third scan lines S31, S32, the third light emission control lines E31, E32, and the data lines Dm-2 to Dm. Such third pixels PXL3 are provided with a data signal from the data lines Dm-2 to Dm when a scan signal is supplied from the third scan lines S31, S32 and the second scan lines S21, S22. The third pixels PXL3 that received the data signal control the amount of current flowing from the first power source ELVDD to the second power source ELVSS via the organic light emitting diode.

In addition, although it is illustrated in FIG. 3 that six third pixels PXL3 are disposed in the third pixel area PXA3 by two third scan lines S31, S32, two third light emission control lines E31, E32 and three data lines Dm-2 to Dm, there is no limitation thereto. That is, the plurality of third pixels PXL3 are arranged to correspond to the size of the third pixel area PXA3, and the number of the third scan lines, the third light emission control lines, and the data lines may be set variously to correspond to the third pixels PXL3.

The first scan driver SDV1 supplies a scan signal to the first scan lines S11 to S1n in response to a first gate control signal GCS1 from the timing control unit TC. For example, the first scan driver SDV1 may supply the scan signal to the first scan lines S11 to S1n sequentially. When the scan signal is sequentially supplied to the first scan lines S11 to S1n, the first pixels PXL1 are sequentially selected in horizontal line units.

The second scan driver SDV2 supplies a scan signal to the second scan lines S21, S22 in response to a second gate control signal GCS2 from the timing control unit TC. Here, the scan signal supplied to the second scan lines S21, S22 is supplied to the third scan lines S31, S32 via the scan line connecting parts ES. The second scan driver SDV2 may supply the scan signal to the second scan lines S21, S22 sequentially. When the scan signal is supplied to the second scan lines S21, S22, sequentially, the second pixels PXL2 and the third pixels PXL3 are selected sequentially in horizontal line units.

The third scan driver SDV3 supplies a scan signal to the third scan lines S31, S32 in response to the third gate control signal GCS3 from the timing control unit TC. Here, the scan signal supplied to the third scan lines S31, S32 is supplied to the second scan lines S21, S22 via the scan line connecting part ES. The third scan driver SDV3 may supply the scan signal sequentially to the third scan lines S31, S32. When the scan signal is supplied to the third scan lines S31, S32 sequentially, the second pixels PXL2 and the third pixels PXL3 are selected sequentially in horizontal line units.

Meanwhile, since the second scan lines S21, S22 and the third scan lines S31, S32 are electrically accessed by the scan line connecting parts ES, the scan signal being supplied from the second scan driver SDV2 and the scan signal being supplied from the third scan driver SDV3 are supplied such that they are synchronized to each other.

For example, the scan signal being supplied from the second scan driver SDV2 to the second scan line S21 may be supplied at the same time as the scan signal being supplied from the third scan driver SDV3 to the third scan line S31. Likewise, the scan signal being supplied from the second scan driver SDV2 to the second scan line S22 may be supplied at the same time as the scan signal being supplied from the third scan driver SDV3 to the third scan line S32.

When a scan signal is supplied to the second scan lines S21, S22 and the third scan lines S31, S32 using the second scan driver SDV2 and the third scan driver SDV3, a delay of scan signal by an RC delay of the second scan lines S21, S22 and the third scan lines S31, S32 may be prevented, and accordingly, it is possible to supply a wanted scan signal to the second scan lines S21, S22 and the third scan lines S31, S32.

In addition, the second scan driver SDV2 and the third scan driver SDV3 may be driven such that they are synchronized to each other, and accordingly, the second scan driver SDV2 and the third scan driver SDV3 may be driven by the same gate control signal GCS. For example, the third gate control signal GCS3 being supplied to the third scan driver SDV3 may be set as the same signal as the second gate control signal GCS2.

The first light emission driver EDV1 supplies a light emission control signal to the first light emission control lines E11 to E1n in response to the fourth gate control signal GCS4 from the timing control unit TC. For example, the first light emission driver EDV1 may supply the light emission control signal to the first light emission control lines E11 to E1n sequentially.

Here, the light emission control signal may be set to have a greater width than the scan signal. For example, the light emission control signal being supplied to the $i^{th}$ (i being a natural number) first light emission control line E1i may be supplied such that it is overlapped with the scan signal being supplied to the $i-1^{th}$ first scan line S1i-1 and the scan signal being supplied to the $i^{th}$ first scan line S1i for at least a partial period of time.

The second light emission driver EDV2 supplies a light emission control signal to the second light emission control lines E21, E22 in response to the fifth gate control signal GCS5 from the timing control unit TC. Here, the light emission control signal supplied to the second light emission control lines E21, E22 is supplied to the third light emission control lines E31, E32 via the light emission control line connecting parts EE. The second light emission control driver EDV2 may supply the light emission control signal to the second light emission control lines E21, E22 sequentially.

The third light emission driver EDV3 supplies the light emission control signal to the third light emission control lines E31, E32 in response to the sixth gate control signal GCS6 from the timing control unit TC. Here, the light emission control signal supplied to the third light emission control lines E31, E32 is supplied to the second light emission control lines E21, E22 via the light emission control line connecting parts EE. The third light emission driver EDV3 may supply the light emission control signal to the third light emission control lines E31, E32 sequentially.

In addition, the light emission control signal may be set to a gate off voltage (for example, high voltage) such that a transistor included in the pixels PXL may be turned-off, and the scan signal may be set to a gate on voltage (for example, low voltage) such that the transistor included in the pixels PXL may be turned-on.

Meanwhile, since the second light emission control lines E21, E22 and the third light emission control lines E31, E32 are electrically accessed by the light emission control line connecting parts EE, the light emission control signal being supplied from the second light emission driver EDV2 and the light emission control signal being supplied from the third light emission driver EDV3 may be supplied such that they are synchronized to each other.

For example, the light emission control signal being supplied from the second light emission driver EDV2 to the second light emission control line E21 may be supplied at the same time as the light emission control signal being supplied from the third light emission control driver EDV3 to the third light emission control line E31. Likewise, the light emission control signal being supplied from the second light emission driver EDV2 to the second light emission control line E22 may be supplied at the same time as the light emission control signal being supplied from the third light emission driver EDV3 to the third light emission control line E32.

When the light emission control signal is supplied to the second light emission control lines E21, E22 and the third light emission control lines E31, E32 using the second light emission driver EDV2 and the third light emission driver EDV3, a delay of light emission control signal by an RC delay of the second light emission control lines E21, E22 and the third light emission control lines E31, E32 may be prevented, and accordingly, it is possible to supply the wanted light emission control signal to the second light emission control lines E21, E22 and the third light emission control lines E31, E32.

In addition, the second light emission driver EDV2 and the third light emission driver EDV3 may be driven such that they are synchronized to each other, and accordingly, the second light emission driver EDV2 and the third light emission driver EDV3 may be driven by the same gate control signal GCS. For example, the sixth gate control signal GCS6 being supplied to the third light emission driver EDV3 may be set as the same signal as the fifth gate control signal GCS5.

The data driver DDV may supply a data signal to the data lines D1 to Dm in response to the data control signal DCS. The data signal supplied to the data lines D1 to Dm is supplied to the pixels PXL selected by the scan signal.

The timing control unit TC supplies the gate control signals GCS1 to GCS6 generated based on the timing signals being supplied from outside to the scan drivers SDV and the light emission drivers EDV, and the data control signal DCS to the data driver DDV.

Each of the gate control signals GCS1 to GCS6 includes a start pulse and clock signals. The start pulse controls the timing of the first scan signal or the first light emission control signal. The clock signals are used to shift the start pulse.

The data control signal DCS includes a source start pulse and clock signals. The source start pulse controls the starting time point of the sampling of the data. The clock signals are used to control the sampling operation.

Meanwhile, when the display device is being driven sequentially, the first scan driver SDV1 may be provided with a last output signal of the second scan driver SDV2 as the start pulse. Likewise, when the display device is being driven sequentially, the first light emission driver EDV1 may be provided with the last output signal of the second light emission driver EDV2 as the start pulse.

Figure 5:
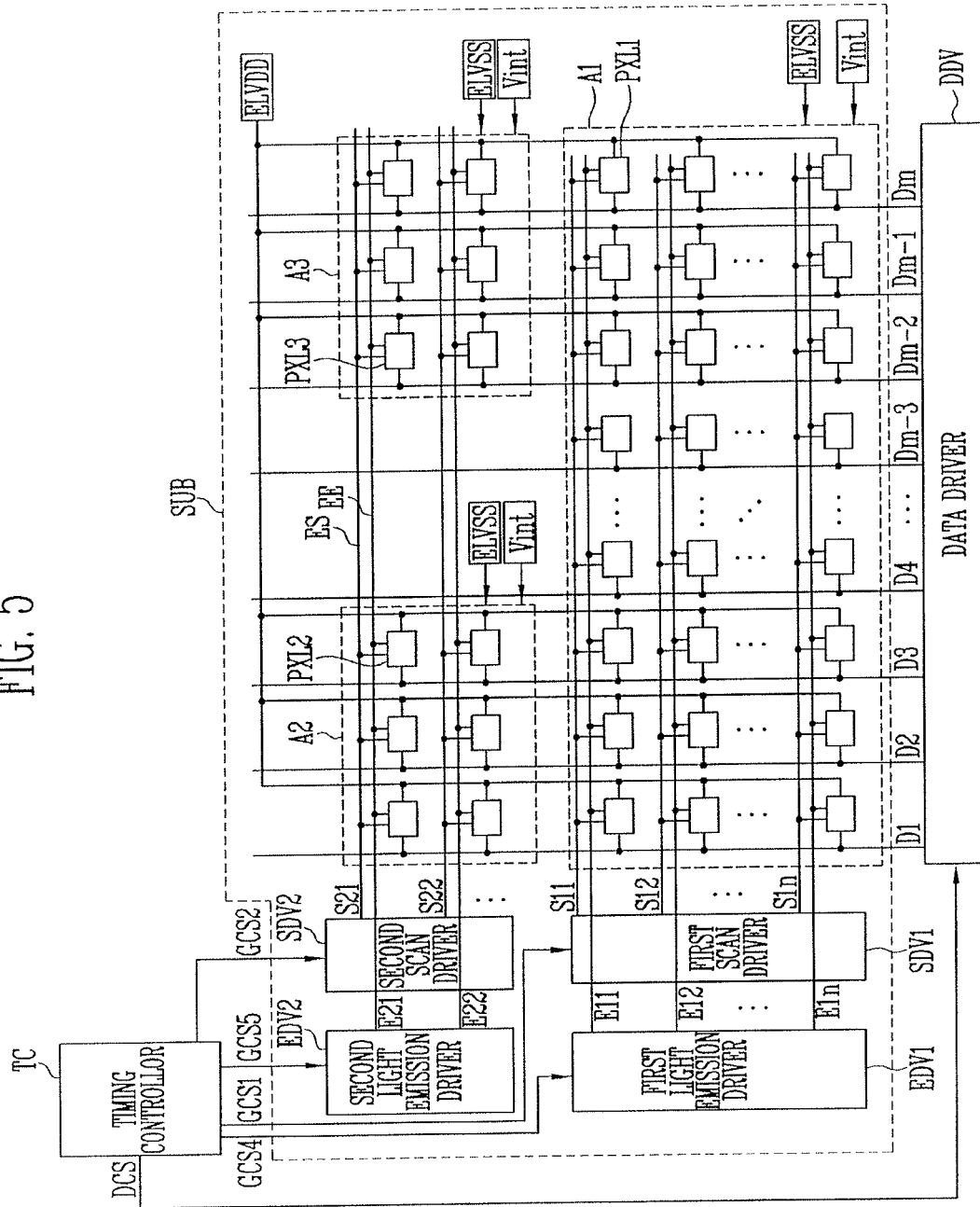
FIG. 5 illustrates a block diagram of pixels and a driver according to another embodiment of the present disclosure.

FIG. 5 is a block diagram illustrating pixels and a driver according to another embodiment of the present disclosure. When explaining FIG. 5, for the configurations identical to those in FIG. 3, the same reference numerals will be allocated, and detailed description thereof will be omitted.

Referring to FIG. 5, the display device according to another embodiment of the present disclosure includes the pixels PXL, the driver, and a wire part.

The pixels PXL include the first to third pixels PXL1, PXL2, PXL3, and the driver includes the first and second scan drivers SDV1, SDV2, the first and second light emission drivers EDV1, EDV2, the data driver DDV, and the timing control unit TC. Comparing FIG. 5 to FIG. 3, the third scan driver SDV3 and the third light emission driver EDV3 may be omitted in FIG. 5.

That is, the display device according to the other embodiment of the present disclosure drives the second scan lines S21 and S22 and the third scan lines S31 and S32 using the second scan driver SDV2, and drives the second light emission control lines E21 and E22 and the third light emission control lines E31 and E32 using the second light emission driver EDV2.

In more detail, the second scan lines S21 and S22 and the third scan lines S31 and S32 are electrically accessed by the scan line connecting parts ES, and the second light emission control lines E21 and E22 and the third light emission control lines E31 and E32 are electrically accessed by the light emission control line connecting parts EE. Therefore, the scan signal from the second scan driver SDV2 may be supplied to the third scan lines S31 and S32 via the second scan lines S21 and S22 and the scan line connecting parts ES. Likewise, the light emission control signal from the second light emission driver EDV2 may be supplied to the third light emission control lines E31 and E32 via the second light emission control lines E21 and E22 and the light emission control line connecting parts EE.

Figure 6:
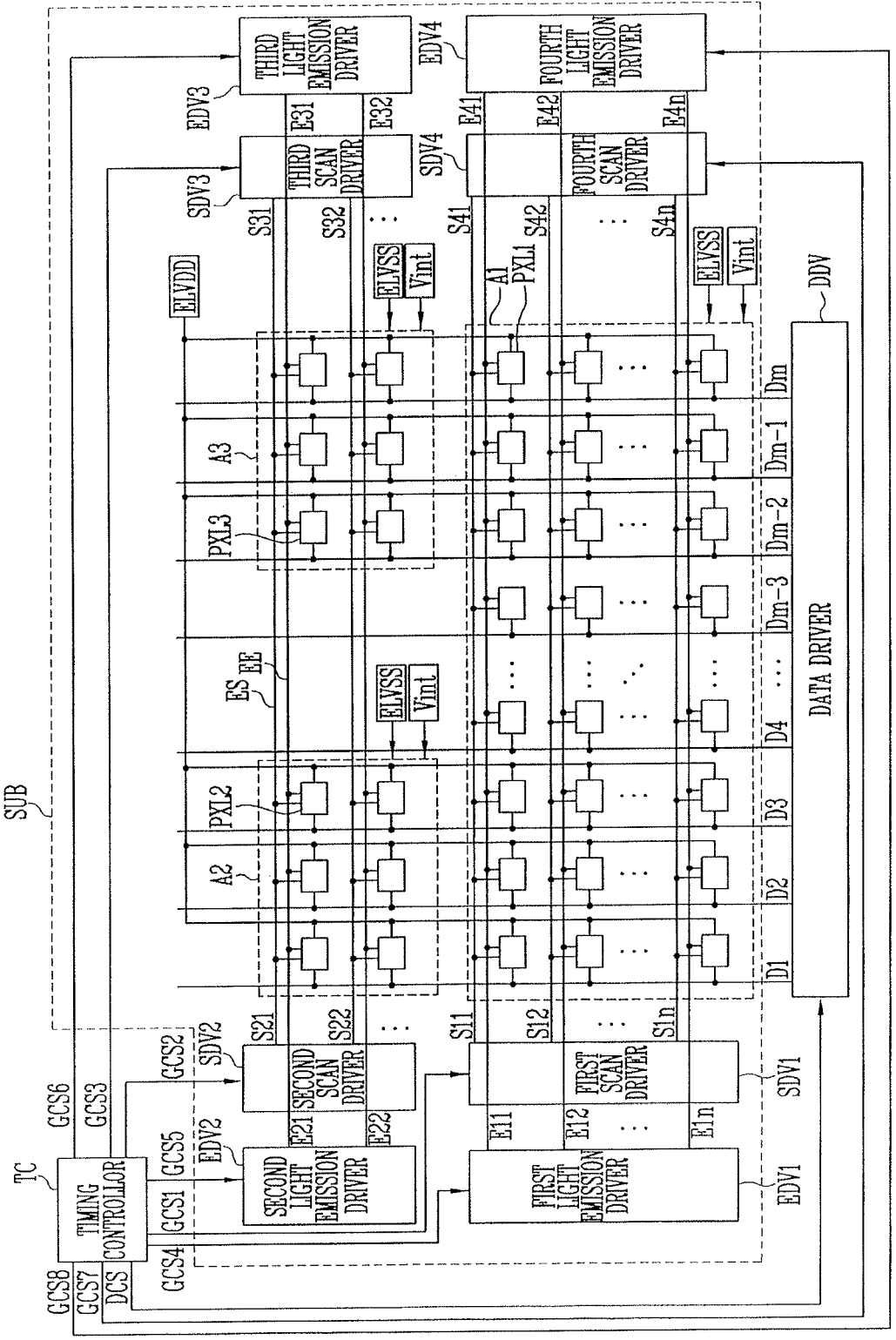
FIG. 6 illustrates a block diagram of pixels and a driver according to yet another embodiment of the present disclosure.

FIG. 6 is a block diagram illustrating pixels and a driver according to yet another embodiment of the present disclosure. When explaining FIG. 6, for the configurations identical to those in FIG. 3, the same reference numerals will be allocated, and detailed description thereof will be omitted.

Referring to FIG. 6, the display device according to the yet another embodiment of the present disclosure includes the pixels PXL, the driver, and the wire part.

The pixels PXL include the first to third pixels PXL1, PXL2, PXL3, the driver includes first to fourth scan drivers SDV1, SDV2, SDV3, SDV4, first to fourth light emission driver EDV1, EDV2, EDV3, EDV4, the data driver DDV, and the timing control unit TC.

The fourth scan driver SDV4 supplies a scan signal to the first scan lines S11 to S1n in response to a seventh gate control signal GCS7 from the timing control unit TC. For example, the fourth scan driver SDV4 may supply the scan signal to the first scan lines S11 to S1n sequentially. When the scan signal is supplied to the first scan lines S11 to S1n sequentially, the first pixels PXL1 are selected sequentially in horizontal line units.

Meanwhile, the fourth scan driver SDV4 supplies a scan signal to the first scan lines S11 to S1n such that it is synchronized with the first scan driver SDV1. For example, the first scan line S11 may be provided with the scan signal from the first scan driver SDV1 and the fourth scan driver SDV4 at the same time. Likewise, the first scan line S1n may be provided with the scan signal from the first scan driver SDV1 and the fourth scan driver SDV4 at the same time.

When the scan signal is supplied to the first scan lines S11 to S1n using the first scan driver SDV1 and the fourth scan driver SDV4, a delay of scan signal by an RC delay of the first scan lines S11 to S1n may be prevented, and accordingly, it is possible to supply the wanted scan signal to the first scan lines S11 to S1n.

Additionally, the first scan driver SDV1 and the fourth scan driver SDV4 may be driven such that they are synchronized to each other, and accordingly, the first scan driver SDV1 and the fourth scan driver SDV4 may be driven by the same gate control signal GCS. For example, the seventh gate control signal GCS7 being supplied to the fourth scan driver SDV4 may be set as the same signal as the first gate control signal GCS1. Meanwhile, when the display device is being driven sequentially, the fourth scan driver SDV4 may be provided with a last output signal of the third scan driver SDV3 as the start pulse.

The fourth light emission driver EDV4 supplies a light emission control signal to the first light emission control lines E11 to E1n in response to an eighth gate control signal GCS8 from the timing control unit TC. For example, the fourth light emission driver EDV4 may supply the light emission control signal to the first light emission control lines E11 to E1n sequentially.

Meanwhile, the fourth light emission driver EDV4 supplies a light emission control signal to the first light emission control lines E11 to E1n such that the fourth light emission driver EDV4 is synchronized with the first light emission driver EDV1. For example, the first light emission control line E11 may be provided with the light emission control signal from the first light emission driver EDV1 and the fourth light emission driver EDV4 at the same time. Likewise, the last first light emission control line E1n may be supplied with the light emission control signal from the first light emission driver EDV1 and the fourth light emission driver EDV4 at the same time.

When the light emission control signal is supplied to the first light emission control lines E11 to E1n using the first light emission driver EDV1 and the fourth light emission driver EDV4 as aforementioned, a delay of light emission control signal by an RC delay of the first light emission control lines E11 to E1n may be prevented, and accordingly, it is possible to supply the wanted light emission control signal to the first light emission control lines E11 to E1n.

Further, the first light emission driver EDV1 and the fourth light emission driver EDV4 may be driven such that they are synchronized to each other, and accordingly, they may be driven by the same gate control signal GCS. For example, the eighth gate control signal GCS8 being supplied to the fourth light emission driver SDV4 may be set as the same signal as the fourth gate control signal GCS4. Meanwhile, when the display device is driven sequentially, the fourth light emission driver EDV4 may be provided with the last output signal of the third light emission driver EDV3 as the start pulse.

Additionally, the drivers SDV1 to SDV4, EDV1 to EDV4 illustrated in FIGS. 3 to 6 may be arranged in various forms by a developer. For example, the third scan driver SDV3, the fourth scan driver SDV4, the third light emission driver EDV3 and the fourth light emission driver EDV4 may be arranged in the display device, and the first scan driver SDV1, the second scan driver SDV2, the first light emission driver EDV1 and the second light emission driver EDV2 may be omitted.

Figure 7:
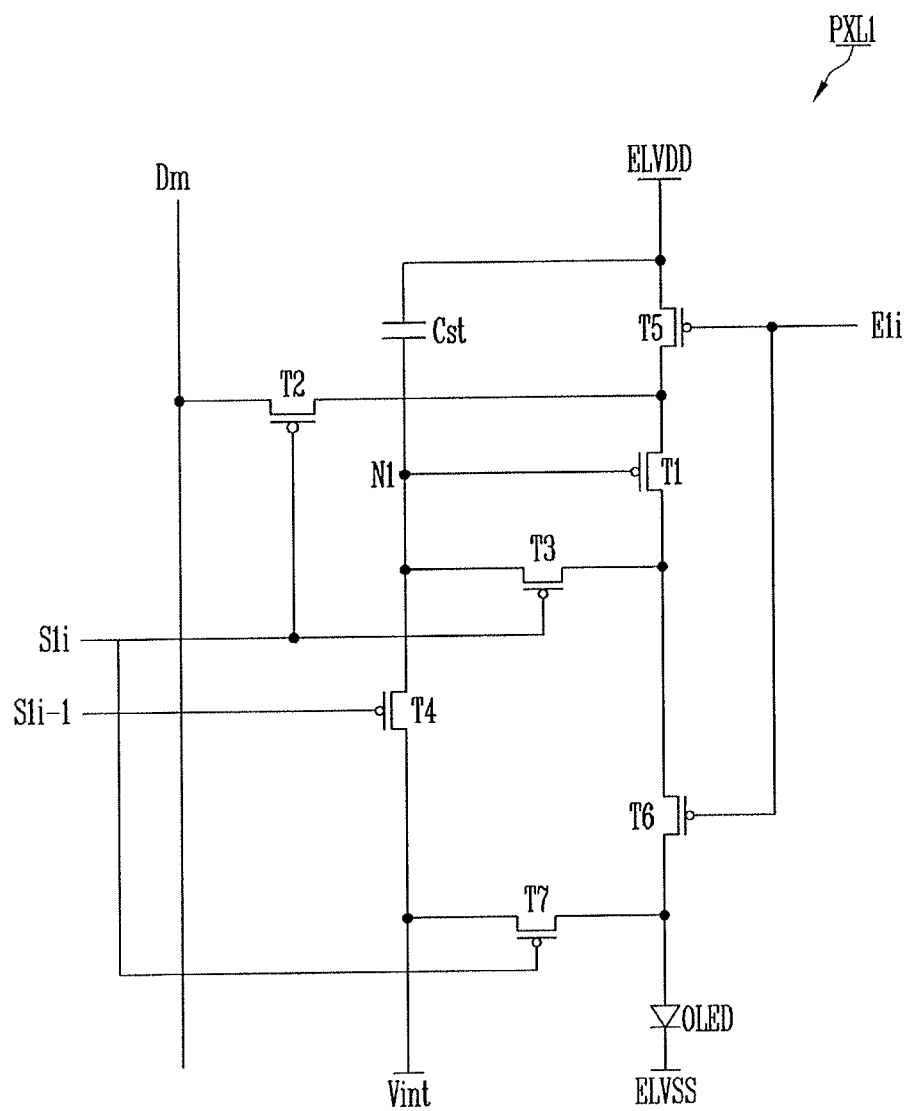
FIG. 7 illustrates a view of an embodiment of a first pixel illustrated in FIG. 3.

FIG. 7 is a view illustrating an example of the first pixel illustrated in FIG. 3. In FIG. 7, for convenience of explanation, a pixel accessed to an $m^{th}$ data line Dm and $i^{th}$ first scan line S1i are illustrated.

Referring to FIG. 7, the first pixel PXL1 according to the embodiment of the present disclosure is provided with an organic light emitting diode OLED, a first transistor T1 to seventh transistor T7, and a storage capacitor Cst.

An anode of the organic light emitting diode OLED is accessed to the first transistor T1 via the sixth transistor T6, and a cathode of the organic light emitting diode OLED is accessed to the second power source ELVSS. Such an organic light emitting diode OLED generates light of a certain brightness that corresponds to the amount of current being supplied from the first transistor T1.

The first power source ELVDD may be set to a higher voltage than the second power source ELVSS such that current may flow to the organic light emitting diode OLED.

The seventh transistor T7 is accessed between an initializing power source Vint and the anode of the organic light emitting diode OLED. Further, the gate electrode of the seventh transistor T7 is accessed to the $i^{th}$ first scan line S1i. Such a seventh transistor T7 is turned-on when the scan signal is being supplied to the $i^{th}$ first scan line S1i, and provides the voltage of the initializing power source Vint to the anode of the organic light emitting diode OLED. Here, the initializing power source Vint may be set to a lower voltage than the data signal.

The sixth transistor T6 is accessed between the first transistor T1 and the organic light emitting diode OLED. Further, the gate electrode of the sixth transistor T6 is accessed to the $i^{th}$ first light emission control line E1i. Such a sixth transistor T6 is turned-off when the light emission control signal is supplied to the $i^{th}$ first light emission control line E1i, and in other cases, the sixth transistor T6 is turned-on.

A fifth transistor T5 is accessed between the first power source ELVDD and the first transistor T1. Further, a gate electrode of the fifth transistor T5 is accessed to the $i^{th}$ first light emission control line E1i. Such a fifth transistor T5 is turned-off when the light emission control signal is being supplied to the $i^{th}$ first light emission control line E1i, and in other cases the fifth transistor T5 is turned-on.

A first electrode of the first transistor T1 (driving transistor) is accessed to the first power source ELVDD via the fifth transistor T5, and a second electrode of the first transistor T1 is accessed to the anode of the organic light emitting diode OLED via the sixth transistor. Further, a gate electrode of the first transistor T1 is accessed to a first node N1. Such a first transistor controls the amount of current flowing from the first power source ELVDD to the second power source ELVSS via the organic light emitting diode OLED in response to the voltage of the first node N1.

A third transistor T3 is accessed between the second electrode of the first transistor T1 and the first node N1. Further, a gate electrode of the third transistor T3 is accessed to the $i^{th}$ first scan line S1i. Such a third transistor T3 is turned-on when a scan signal is being supplied to the $i^{th}$ first scan line S1i, and electrically accesses the second electrode of the first transistor T1 and the first node N1. Therefore, when the third transistor T3 is turned-on, the first transistor T1 is accessed in a diode form.

A fourth transistor T4 is accessed between the first node N1 and the initializing power source Vint. Further, a gate electrode of the fourth transistor T4 is accessed to an $i-1^{th}$ first scan line S1i-1. Such a fourth transistor T4 is turned-on when a scan signal is being supplied to the $i-1^{th}$ first scan line S1i-1, and supplies the voltage of the initializing power source Vint to the first node N1.

A second transistor T2 is accessed between the $m^{th}$ data line Dm and the first electrode of the first transistor T1. Further, a gate electrode of the second transistor T2 is accessed to the $i^{th}$ first scan line S1i. Such a second transistor T2 is turned-on when a scan signal is being supplied to the $i^{th}$ first scan line S1i, and electrically accesses the $m^{th}$ data line Dm and the first electrode of the first transistor T1.

The storage capacitor Cst is accessed between the first power source ELVDD and the first node N1. Such a storage capacitor Cst stores a data signal and a voltage corresponding to a threshold voltage of the first transistor.

Meanwhile, the second pixel PXL2 and the third pixel PXL3 may be realized in a same circuit as the first pixel PXL1. Therefore, detailed explanation on the second pixel PXL2 and the third pixel PXL3 is omitted.

Figure 8:
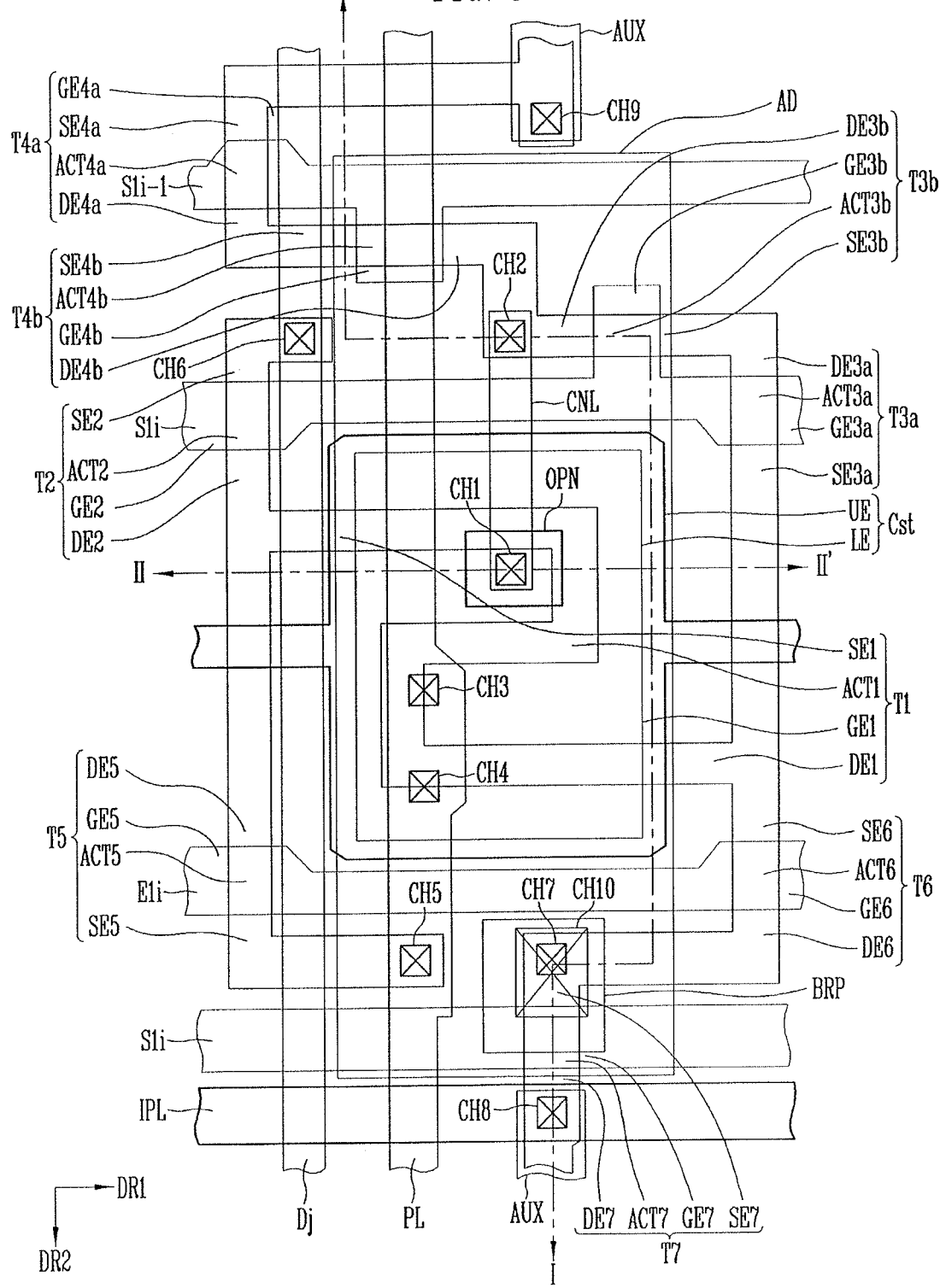
FIG. 8 illustrates a plan view of a detailed first pixel of FIG. 3.
Figure 9:
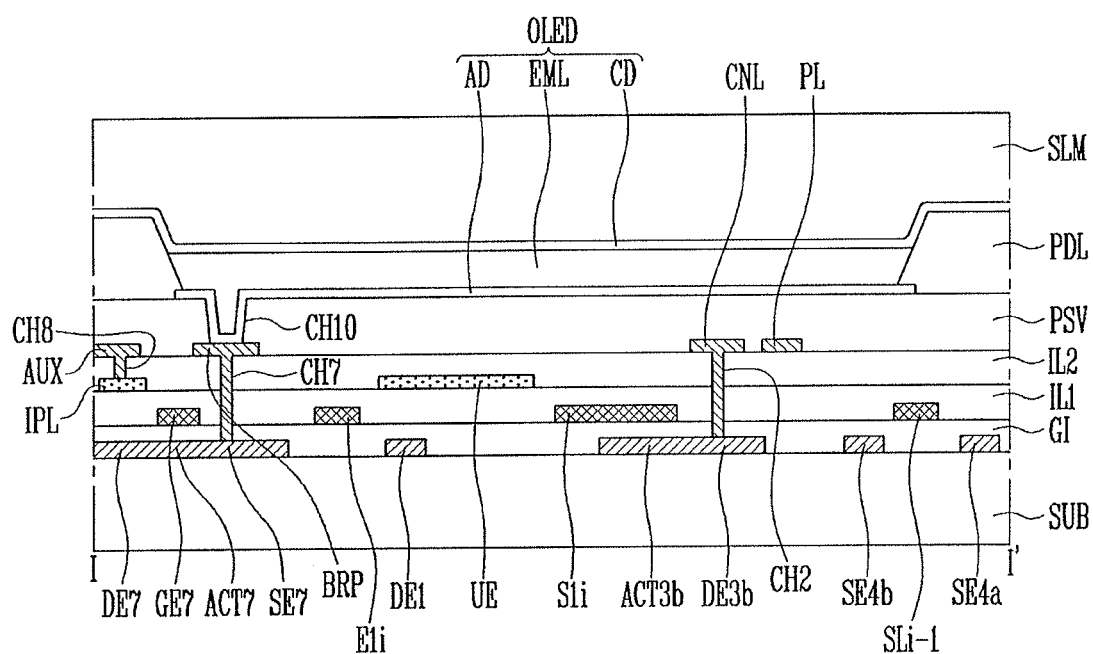
FIG. 9 illustrates a cross-sectional view taken along line I-I' of FIG. 8.
Figure 10:
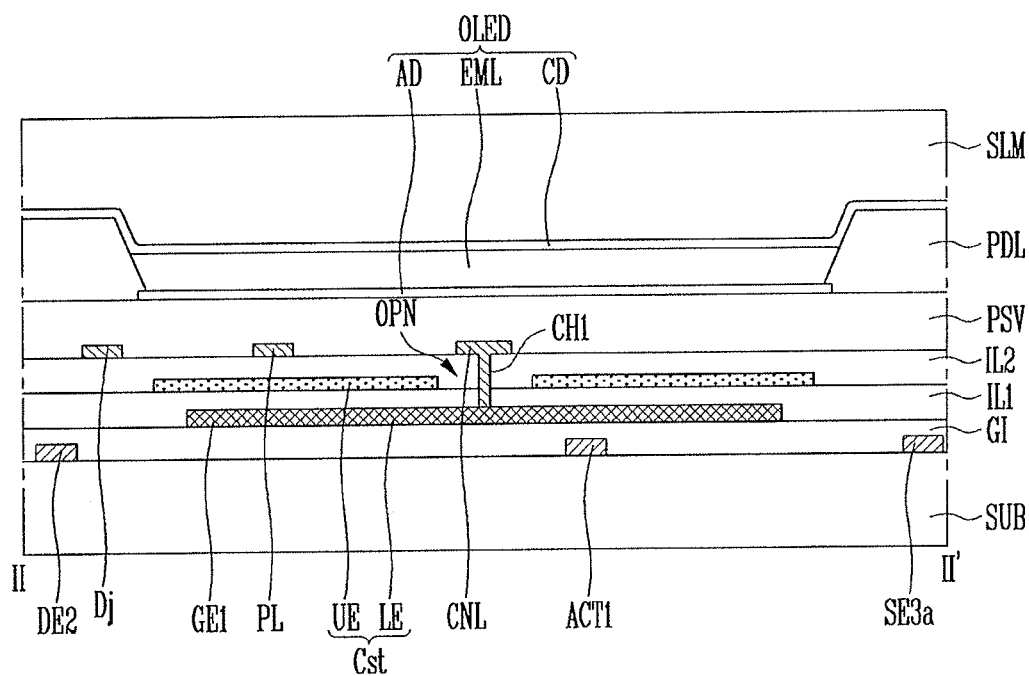
FIG. 10 illustrates a cross-sectional view taken along line II-II' of FIG. 8.

FIG. 8 is a plan view illustrating in detail the first pixel of FIG. 3, FIG. 9 is a cross-sectional view taken on line I-I' of FIG. 8, and FIG. 10 is a cross-sectional view taken on line II-II' of FIG. 8.

FIGS. 8 to 10 illustrate two first scan lines S1i-1, S1i, the first light emission control line E1i, the power source line PL and the data line Dj connected to one first pixel PXL1 arranged in an $i^{th}$ row and a $j^{th}$ column arranged in the first pixel area PXA1. In FIGS. 9 and 10, for convenience of explanation, the first scan line of an $i-1^{th}$ row is indicated as "$i-1^{th}$ first scan line S1i-1", the first scan line of an $i^{th}$ row is indicated as "$i^{th}$ first scan line S1i", the light emission control line of an $i^{th}$ row is indicated as "light emission control line E1i", the data line of a $j^{th}$ column is indicated as "data line Dj", and a $j^{th}$ power source line is indicated as "power source line PL".

Referring to FIGS. 3 to 10, the display device may include the substrate SUB, the wire part and the pixels PXL.

The substrate SUB may be made of an insulating material such as glass and resin, etc. Further, the substrate SUB may be made of a material having flexibility such that the substrate SUB may be bent or folded, and may have a single-layered structure or a multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose and cellulose acetate propionate. However, the material that constitutes the substrate SUB may vary, and may contain fiber reinforced plastic (FRP) and the like.

The wire part may provide a signal to each first pixel PXL, and may include the first scan lines S1i-1, S1i, the first light emission control line E1i, the power source line PL and the initializing power source line IPL.

The first scan lines S1i-1, S1i may extend in the first direction DR1. The first scan lines S1i-1, S1i may include an $i-1^{th}$ first scan line S1i-1 and an $i^{th}$ first scan line S1i sequentially arranged along the second direction DR2. The first scan lines S1i-1, S1i may be applied with a scan signal. For example, the $i-1^{th}$ first scan line S1i-1 may be applied with an $i-1^{th}$ scan signal, and the $i^{th}$ first scan line S1i may be applied with an $i^{th}$ scan signal. The $i^{th}$ first scan line S1i may divaricate into two lines, and the divaricated $i^{th}$ first scan lines S1i may be connected to different transistors. For example, the $i^{th}$ first scan line S1i may include an upper $i^{th}$ first scan line S1i adjacent to the $i-1^{th}$ first scan line S1i-1, and a lower $i^{th}$ first scan line S1i that is farther away than the $i-1^{th}$ first scan line S1i-1 and the upper $i^{th}$ first scan line S1i.

The first light emission control line E1i may extend in the first direction DR1. The first light emission control line E1i is arranged to be spaced apart from the $i^{th}$ first scan lines S1i between two $i^{th}$ first scan lines S1i. The first light emission control line E1i may be applied with a light emission control signal.

The data line Dj may extend in the second direction DR2. The data line Dj may be applied with a data signal.

The power source line PL may extend along the second direction DR2. The power source line PL may be arranged to be spaced apart from the data line Dj. The power source line PL may be applied with the first power source ELVDD.

The initializing power source line IPL may extend in the first direction DR1. The initializing power source line IPL may be provided between the lower $i^{th}$ first scan line S1i and an $i-1^{th}$ first scan line S1i-1 of a next row pixel. The initializing power source line IPL may be applied with the initializing power source Vint.

Each first pixel PXL1 may include the first transistor T1 to seventh transistor T7, the storage capacitor Cst and the organic light emitting diode OLED.

The first transistor T1 may include a first gate electrode GE1, a first active pattern ACT1, a first source electrode SE1, a first drain electrode DE1 and a connecting line CNL.

The first gate electrode GE1 may be connected to a third drain electrode DE3 of the third transistor T3 and a fourth drain electrode DE4 of the fourth transistor T4. The connecting line CNL may connect the first gate electrode GE1, and the third drain electrode DE3 and the fourth drain electrode DE4. One end of the connecting line CNL may be connected to the first gate electrode GE1 through a first contact hole CH1, and another end of the connecting line CNL may be connected to the third drain electrode DE3 and the fourth drain electrode DE4 through a second contact hole CH2.

In an embodiment of the present disclosure, the first active pattern ACT1 and the first source electrode SE1 and the first drain electrode DE1 may be formed of a semiconductor layer doped or not doped with impurities. For example, the first source electrode SE1 and the first drain electrode DE1 may be made of a semiconductor layer doped with impurities while the first active pattern ACT1 is made of a semiconductor layer not doped with impurities.

The first active pattern ACT1 may have the shape of a bar extending in a certain direction, bent for a plurality of times along the extending longitudinal direction. The first active pattern ACT1 may be overlapped with the first gate electrode GE1 when seen from a plan view. As the first active pattern ACT1 is formed at length, a channel area of the first transistor T1 may be formed at length. Accordingly, a driving range of the gate voltage being applied to the first transistor T1 increases. Accordingly, it is possible to control the gradation of the light being emitted from the organic light emitting diode OLED thereafter.

The first source electrode SE1 may be connected to one end of the first active pattern ACT1. The first source electrode SE1 may be connected to a second drain electrode DE2 of the second transistor T2 and to a fifth drain electrode DE5 of the fifth transistor T5. The first drain electrode DE1 may be connected to another end of the first active pattern ACT1. The first drain electrode DE1 may be connected to a third source electrode SE3 of the third transistor T3 and to a sixth source electrode SE6 of the sixth transistor T6.

The second transistor T2 may include a second gate electrode GE2, a second active pattern ACT2, a second source electrode SE2 and a second drain electrode DE2.

The second gate electrode GE2 may be connected to the upper $i^{th}$ first scan line S1i. The second gate electrode GE2 may be provided as a portion of the upper $i^{th}$ first scan line S1i or in a shape protruding from the upper $i^{th}$ first scan line S1i. In an embodiment of the present disclosure, the second active pattern ACT2, the second source electrode SE2 and the second drain electrode DE2 may be formed of a semiconductor layer doped or not doped with impurities. For example, the second source electrode SE2 and the second drain electrode DE2 may be made of a semiconductor layer doped with impurities while the second active pattern ACT2 is made of a semiconductor layer not doped with impurities. The second active pattern ACT2 is a portion that is overlapped with the second gate electrode GE2. One end of the second source electrode SE2 may be connected to the second active pattern ACT2. Another end of the second source electrode SE2 may be connected to the data line Dj through a sixth contact hole CH6. One end of the second drain electrode DE2 may be connected to the second active pattern ACT2. Another end of the second drain electrode DE2 may be connected to the first source electrode SE1 of the first transistor T1 and to the fifth drain electrode DE5 of the fifth transistor T5.

The third transistor T3 may be provided in a double gate structure in order to prevent leakage current. That is, the third transistor T3 may include a $3a^{th}$ transistor T3a and a $3b^{th}$ transistor T3b. The $3a^{th}$ transistor T3a may include a $3a^{th}$ gate electrode GE3a, a $3a^{th}$ active pattern ACT3a, a $3a^{th}$ source electrode SE3a and a $3a^{th}$ drain electrode DE3a. The $3b^{th}$ transistor T3b may include a $3b^{th}$ gate electrode GE3b, a $3b^{th}$ active pattern ACT3b, a $3b^{th}$ source electrode SE3b and a $3b^{th}$ drain electrode DE3b. Hereinafter, the $3a^{th}$ gate electrode GE3a and the $3b^{th}$ gate electrode GE3b will be indicated as a third gate electrode GE3, the $3a^{th}$ active pattern ACT3a and the $3b^{th}$ active pattern ACT3b will be indicated as a third active pattern ACT3, and the $3a^{th}$ drain electrode DE3a and the $3b^{th}$ drain electrode DE3b will be indicated as a third drain electrode DE3.

The third gate electrode GE3 may be connected to the upper $i^{th}$ first scan line S1i. The third gate electrode GE3 may be provided as a portion of the upper $i^{th}$ first scan line S1i or in a shape protruding from the upper $i^{th}$ first scan line S1i. For example, the $3a^{th}$ gate electrode GE3a may be provided in a shape protruding from the upper $i^{th}$ first scan line S1i, while the 3bth gate electrode GE3b is provided as a portion of the upper $i^{th}$ first scan line S1i.

The third active pattern ACT3, the third source electrode SE3 and the third drain electrode DE3 may be formed of a semiconductor layer doped or not doped with impurities. For example, the third source electrode SE3 and the third drain electrode DE3 may be made of a semiconductor layer doped with impurities while the third active pattern ACT3 is made of a semiconductor layer not doped with impurities. The third active pattern ACT3 is a portion overlapped with the third gate electrode GE3. One end of the third source electrode SE3 may be connected to the third active pattern ACT3. Another end of the third source electrode SE3 may be connected to the first drain electrode DE1 of the first transistor T1 and to the sixth source electrode SE6 of the sixth transistor T6. The one end of the third drain electrode DE3 may be connected to the third active pattern ACT3. The other end of the third drain electrode DE3 may be connected to the fourth drain electrode DE4 of the fourth transistor T4. Further, the third drain electrode DE3 may be connected to the first gate electrode GE1 of the first transistor T1 through the connecting line CNL, the second contact hole CH2 and the first contact hole CH1.

The fourth transistor T4 may be provided in a double gate structure in order to prevent leakage current. That is, the fourth transistor T4 may include a $4a^{th}$ transistor and a $4b^{th}$ transistor. The $4a^{th}$ transistor T4 may include a $4a^{th}$ gate electrode GE4a, a $4a^{th}$ active pattern ACT4a, a $4a^{th}$ source electrode SE4a and a $4a^{th}$ drain electrode DE4a, and the $4b^{th}$ transistor may include a $4b^{th}$ gate electrode GE4b, a $4b^{th}$ active pattern ACT4b, a $4b^{th}$ source electrode SE4b and a $4b^{th}$ drain electrode DE4b. Hereinafter, the $4a^{th}$ gate electrode GE4a and the $4b^{th}$ gate electrode GE4b will be indicated as a fourth gate electrode GE4, the $4a^{th}$ active pattern ACT4a and the $4b^{th}$ active pattern ACT4b will be indicated as a fourth active pattern ACT4, the 4ath source electrode SE4a and the 4bth source electrode SEb4 will be indicated as the fourth source electrode SE4, and the $4a^{th}$ drain electrode DE4a and the $4b^{th}$ drain electrode DE4b will be indicated as a fourth drain electrode DE4.

The fourth gate electrode GE4 may be connected to the $i-1^{th}$ first scan line S1i–1. The fourth gate electrode GE4 may be provided as a portion of the $i-1^{th}$ first scan line S1i–1 or in a shape protruding from the $i-1^{th}$ first scan line S1i–1. For example, the $4a^{th}$ gate electrode GE4a may be provided as a portion of the $i-1^{th}$ first scan line S1i–1. The $4b^{th}$ gate electrode GE4b may be provided in a shape protruding from the first scan line S1i–1.

The fourth active pattern ACT4, the fourth source electrode SE4 and the fourth drain electrode DE4 may be formed of a semiconductor layer doped or not doped with impurities. For example, the fourth source electrode SE4 and the fourth drain electrode DE4 may be made of a semiconductor layer doped with impurities while the fourth active pattern ACT4 is made of a semiconductor layer not doped with impurities. The fourth active pattern ACT4 is a portion overlapped with the fourth gate electrode GE4.

One end of the fourth source electrode SE4 may be connected to the fourth active pattern ACT4. Another end of the fourth source electrode SE4 may be connected to an initializing power source line IPL of a pixel of a previous row and to a seventh drain electrode DE7 of the seventh transistor T7 of the pixel of the previous row. An auxiliary connecting line AUX may be provided between the fourth source electrode SE4 and the initializing power source line IPL. One end of the auxiliary connecting line AUX may be connected to the fourth source electrode SE4 through a ninth contact hole CH9. Another end of the auxiliary connecting line AUX may be connected to the initializing power source line IPL of the previous row through an eighth contact hole of the previous row. One end of the fourth drain electrode DE4 may be connected to the fourth active pattern ACT4. Another end of the fourth drain electrode DE4 is connected to the third drain electrode DE3 of the third transistor T3. The fourth drain electrode DE4 is also connected to the first gate electrode GE1 of the first transistor T1 through the connecting line CNL, the second contact hole CH2 and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be connected to the first light emission control line E1i. The fifth gate electrode GE5 may be provided as a portion of the first light emission control line E1i or in a shape protruding from the first light emission control line E1i. The fifth active pattern ACT5, the fifth source electrode SE5 and the fifth drain electrode DE5 is formed of a semiconductor layer doped or not doped with impurities. For example, the fifth source electrode SE5 and the fifth drain electrode DE5 may be made of a semiconductor layer doped with impurities while the fifth active pattern ACT5 is made of a semiconductor layer not doped with impurities. The fifth active pattern ACT5 is a portion overlapped with the fifth gate electrode GE5. One end of the fifth source electrode SE5 may be connected to the fifth active pattern ACT5. Another end of the fifth source electrode SE5 may be connected to the power source line PL through a fifth contact hole CH5. One end of the fifth drain electrode DE5 may be connected to the fifth active pattern ACT5. Another end of the fifth drain electrode DE5 may be connected to the first source electrode SE1 of the first transistor T1 and to the second drain electrode DE2 of the second transistor T2.

The sixth transistor T6 may include a sixth gate electrode GE6, a sixth active pattern ACT6, a sixth source electrode SE6 and a sixth drain electrode DE6.

The sixth gate electrode GE6 may be connected to the first light emission control line E1i. The sixth gate electrode GE6 may be provided as a portion of the first light emission control line E1i or in a shape protruding from the first light emission control line E1i. The sixth active pattern ACT6, the sixth source electrode SE6 and the sixth drain electrode DE6 is formed of a semiconductor layer doped or not doped with impurities. For example, the sixth source electrode SE6 and the sixth drain electrode DE6 may be made of a semiconductor layer doped with impurities while the sixth active pattern ACT6 is made of a semiconductor layer not doped with impurities. The sixth active pattern ACT6 is a portion overlapped with the sixth gate electrode GE6. One end of the sixth source electrode SE6 may be connected to the sixth active pattern ACT6. Another end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. Another end of the sixth drain electrode DE6 may be connected to a seventh source electrode SE7 of the seventh transistor T7.

The seventh transistor T7 may include a seventh gate electrode GE7, a seventh active pattern ACTT, the seventh source electrode SE7 and the seventh drain electrode DE7.

The seventh gate electrode GE7 may be connected to the lower $i^{th}$ first scan line S1i. The seventh gate electrode GE7 may be provided as a portion of the lower $i^{th}$ first scan line S1i or in a shape protruding from the lower first $i^{th}$ scan line S1i. The seventh active pattern ACT7, the seventh source electrode SE7 and the seventh drain electrode DE7 may be formed of a semiconductor layer doped or not doped with impurities. For example, the seventh source electrode SE7 and the seventh drain electrode DE7 may be made of a semiconductor layer doped with impurities while the seventh active pattern ACT7 is made of a semiconductor layer not doped with impurities. The seventh active pattern ACT7 is a portion overlapped with the seventh gate electrode GE7. One end of the seventh source electrode SE7 may be connected to the seventh active pattern ACT7. Another end of the seventh source electrode SE7 may be connected to the sixth drain electrode DE6 of the sixth transistor T6. The one end of the seventh drain electrode DE7 may be connected to the seventh active pattern ACT7. The other end of the seventh drain electrode DE7 may be connected to the initializing power source line IPL. Further, the seventh drain electrode DE7 may be connected to the fourth source electrode SE4 of the fourth transistor T4 of a pixel of a next row. The seventh drain electrode DE7 and the fourth source electrode SE4 of the fourth transistor T4 of the pixel of the next row may be connected to each other through the auxiliary connecting line AUX, the eighth contact hole CH8 and the ninth contact hole CH9.

The storage capacitor Cst may include a lower electrode LE and an upper electrode UE. The lower electrode LE may be formed of the first gate electrode GE1 of the first transistor T1.

The upper electrode UE may be overlapped with the first gate electrode GE1, and may cover the lower electrode LE when seen from a plan view. By increasing the surface area where the upper electrode UE and the lower electrode LE overlap with each other, it is possible to increase the capacitance of the storage capacitor Cst. The upper electrode UE may extend in the first direction DR1. In an embodiment of the present disclosure, to the upper electrode UE, a voltage of the same level as the first power source may be applied. The upper electrode UE may have an opening OPN in an area where the first contact hole CH1 touched by the first gate electrode GE1 and the connecting line CNL is formed.

The organic light emitting diode OLED may include a first electrode AD, a second electrode CD, and a light emitting layer EML provided between the first electrode AD and the second electrode CD.

The first electrode AD may be provided within the light emitting area corresponding to each first pixel PXL1. The first electrode AD may be connected to the seventh source electrode SE7 of the seventh transistor T7 and the sixth drain electrode DE6 of the sixth transistor T6 through a seventh contact hole CH7 and a tenth contact hole CH10. A bridge pattern BRP may be provided between the seventh contact hole CH7 and the tenth contact hole CH10. The bridge pattern BRP may connect the sixth drain electrode DE6, the seventh source electrode SE7 and the first electrode AD.

Hereinafter, the structure of the display device according to an embodiment of the present disclosure will be explained in the stacking order with reference to FIGS. 8 to 10.

Active patterns ACT1 to ACT7 (hereinafter referred to as ACT) may be provided on the base substrate BS. The active pattern may include a first active pattern ACT1 to a seventh active pattern ACT7. The first active pattern ACT1 to the seventh active pattern ACT7 may be made of a semiconductor material.

Between the base substrate BS and the first active pattern ACT1 to the seventh active pattern ACT7, a buffer layer (not illustrated) may be provided.

On base substrate BS where the first active pattern ACT1 to the seventh active pattern ACT7 are formed, a gate insulating film GI may be provided.

On the gate insulating film GI, the i-1$^{th}$ first scan line S1i-1, the i$^{th}$ first scan line S1i, the light emission control line E1i and the first gate electrode GE1 and the seventh gate electrode GE7 may be provided. The first gate electrode GE1 may be the lower electrode LE of the storage capacitor Cst. The second gate electrode GE2 and the third gate electrode GE3 may be formed integrally with the upper i$^{th}$ first scan line S1i. The fourth gate electrode GE4 may be formed integrally with the i-1$^{th}$ first scan line S1i-1. The fifth gate electrode GE5 and the sixth gate electrode GE6 may be formed integrally with the light emission control line E1i. The seventh gate electrode GE7 may be formed integrally with the lower i$^{th}$ first scan line S1i.

On the base substrate BS where the i-1$^{th}$ first scan line S1i-1 and the like are formed, a first interlayer insulating film IL1 may be provided.

On the first interlayer insulating film IL1, the upper electrode UE of the storage capacitor Cst and the initializing power source line IPL may be provided. The upper electrode UE may cover the lower electrode LE. The upper electrode UE may constitute the storage capacitor Cst together with the lower electrode LE with the first interlayer insulating film IL1 disposed therebetween.

On the base substrate BS where the upper electrode UE and the like are formed, a second interlayer insulating film IL2 may be provided.

On the second interlayer insulating film IL2, a data line Dj, a power source line PL, a connecting line CNL, an auxiliary connecting line AUX, and a bridge pattern BRP may be provided.

The data line Dj may be connected to the second source electrode SE2 through the sixth contact hole CH6 that penetrates the first interlayer insulating film IL1, the second interlayer insulating film IL2, and the gate insulating film GI. The power source line PL may be connected to the upper electrode UE of the storage capacitor Cst through a third and fourth contact hole CH3, CH4 that penetrate the second interlayer insulating film IL2.

The power source line PL may also be connected to the fifth source electrode SE5 that penetrates the first interlayer insulating film IL1, the second interlayer insulating film IL2, and the gate insulating film GI.

The connecting line CNL may be connected to the first gate electrode GE1 through the first contact hole CH1 that penetrates the first interlayer insulating film IL1 and the second interlayer insulating film IL2. Further, the connecting line CNL may be connected to the third drain electrode DE3 and the fourth drain electrode DE4 through the second contact hole CH2 that penetrates the gate insulating film GI, the first interlayer insulating film IL1 and the second interlayer insulating film IL2.

The auxiliary connecting line AUX may be connected to the initializing power source line IPL through the eighth contact hole CH8 that penetrates the second interlayer insulating film IL2. Further, the auxiliary connecting line AUX may be connected to the fourth source electrode SE4 and the seventh drain electrode DE7 of the previous row through the ninth contact hole CH9 that penetrates the gate insulating film GI, the first interlayer insulating film IL1 and the second interlayer insulating film IL2.

The bridge pattern BRP may be a pattern provided as a medium between the sixth drain electrode DE6 and the first electrode AD to connect the sixth drain electrode DE6 and the first electrode AD. The bridge pattern BRP is connected to the sixth drain electrode DE6 and the seventh source electrode SE7 through the seventh contact hole CH7 that penetrates the gate insulating film GI, the first interlayer insulating film ILL the second interlayer insulating film IL2.

On the base substrate BS where the first data line DL1 and the like are formed, a protection layer PSV may be provided.

On the protection layer PSV, the organic light emitting diode OLED may be provided. The organic light emitting diode OLED may include the first electrode AD, the second electrode CD, and the light emitting layer EML provided between the first electrode AD and the second electrode CD.

The first electrode AD may be provided on the protection layer PSV. The first electrode AD may be connected to the bridge pattern BRP through the tenth contact hole CH10 that penetrates the protection layer PSV. Since the bridge pattern BRP is connected to the sixth drain electrode DE6 and to the seventh source electrode SE7 through the seventh contact hole CH7, the first electrode AD may finally be connected to the sixth drain electrode DE6 and to the seventh source electrode SE7.

On the base substrate BS where the first electrode AD and the like are formed, a pixel defining film PDL for dividing the light emitting area to correspond to each pixel PXL may be provided. The pixel defining layer PDL may protrude from the base substrate BS along the circumference of the pixel PXL while exposing an upper surface of the first electrode AD.

In the light emitting area surrounded by the pixel defining film PDL, the light emitting layer EML is provided, and on the light emitting layer EML, the second electrode CD may be provided. On the second electrode CD, an encapsulating film SLM that covers the second electrode CD may be provided.

One of the first electrode AD and the second electrode CD may be an anode electrode, and the other one may be a cathode electrode. For example, the first electrode AD may be an anode electrode and the second electrode CD may be a cathode electrode.

Further, at least one of the first electrode AD and the second electrode CD may be a transmissive type electrode. For example, in the case where the light emitting diode OLED is a rear surface light emitting type organic light emitting diode, the first electrode AD may be a transmissive type electrode and the second electrode CD may be a reflective type electrode. In the case where the light emitting diode OLED is a front surface light emitting type organic light emitting diode, the first electrode may be a reflective type electrode, and the second electrode may be a transmissive type electrode. In the case where the light emitting diode OLED is a both side light emitting type organic light emitting diode, both the first electrode AD and the second electrode CD may be transmissive type electrodes. The present embodiment is explained based on an assumption that the light emitting diode OLED is a front surface light emitting type organic light emitting diode, and the first electrode AD is an anode electrode.

The first electrode AD may include a reflecting film (not illustrated) capable of reflecting light and a transparent conductive film (not illustrated) arranged on an upper portion or a lower portion of the reflecting film. At least one of the transparent conductive film and the reflecting film may be accessed to the drain electrode DE.

The reflecting film may include a material that can reflect light. For example, the reflecting film may include at least one of aluminum (Al), silver (Ag), chrome (Cr), molybdenum (Mo), platinum (Pt), nickel (Ni) and an alloy thereof.

The transparent conductive film may include a transparent conductive oxide. For example, the transparent conductive film may include at least one transparent conductive oxide of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining film PDL may include an organic insulating material. For example, the pixel defining film PDL may at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin and silane based resin.

The light emitting layer EML may be arranged on the exposed surface of the first electrode AD. The light emitting layer EML may be arranged on the exposed surface of the first electrode AD. The light emitting layer EML may have a multi-layered thin film structure that includes at least a light generation layer LGL. For example, the light emitting layer EML may be provided with a hole injection layer HIL for injecting a hole, a hole transport layer HTL having excellent hole transportability and configured to increase the opportunity of recombination of holes and electrons by restricting migration of the electrons that failed to combine in the light generation layer, the light generation layer for emitting light by recombination of the injected electrons and holes, a hole blocking layer HBL for restricting migration of the holes that failed to combine in the light generation layer, an electron transport layer ETL for smoothly transporting the electrons to the light generation layer, and an electron injection layer EIL for injecting the electrons.

The color of the light being generated in the light generation layer may be one of red, green, blue and white, but there is no limitation thereto in the present embodiment. For example, the color of the light being generated in the light generation layer may be one of magenta, cyan, and yellow.

The hole injection layer, the hole transport layer, the hole blocking layer, the electron transport layer and the electron injection layer may be a common film connected in light emitting areas adjacent to one another.

The second electrode CD may be a semi-transmissive reflecting film. For example, the second electrode CD may be a thin metal layer having a thickness enough to transmit the light being emitted from the light emitting layer EML. The second electrode CD may transmit a portion of the light emitted from the light emitting layer EML but reflect the rest of the light emitted from the light emitting layer EML.

The second electrode CD may include a material having a lower work function than the transparent conductive film. For example, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca) and an alloy thereof.

A portion of the light emitted from the light emitting layer EML may not transmit the second electrode CD, and the light reflected by the second electrode CD may be reflected again by the reflecting film. That is, between the reflecting film and the second electrode CD, the light emitted from the light emitting layer EML may resonate. By the resonation of the light, the light extraction efficiency of the organic light emitting diode OLED may be improved.

The distance between the reflecting film and the second electrode CD may differ depending on the color of the light emitted from the light emitting layer EML. That is, depending on the color of the light emitted from the light emitting layer EML, the distance between the reflecting film and the second electrode CD may be adjusted to be suitable to the resonating distance.

The encapsulating film SLM may prevent oxygen and moisture from penetrating the light emitting diode OLED. The encapsulating film SLM may include a plurality of inorganic films (not illustrated) and a plurality of organic films (not illustrated). For example, the encapsulating film (SLM) may include a plurality of unit encapsulating layers that include the inorganic film and the organic film arranged on the inorganic film. Further, on a lowermost portion and an uppermost portion of the encapsulating film SLM, the inorganic film may be arranged. The inorganic film may include at least one of silicon oxide, silicon nitride, silicon oxynitride, aluminum oxide, titanium oxide, zirconium oxide and tin oxide.

In an embodiment of the present disclosure, the second pixel PXL2 provided in the second pixel area PXA2 and the third pixel PXL3 provided in the third pixel area PXA3 have substantially a same pixel structure as the first pixel PXL1, and thus repeated explanation thereof is omitted.

Figure 11:
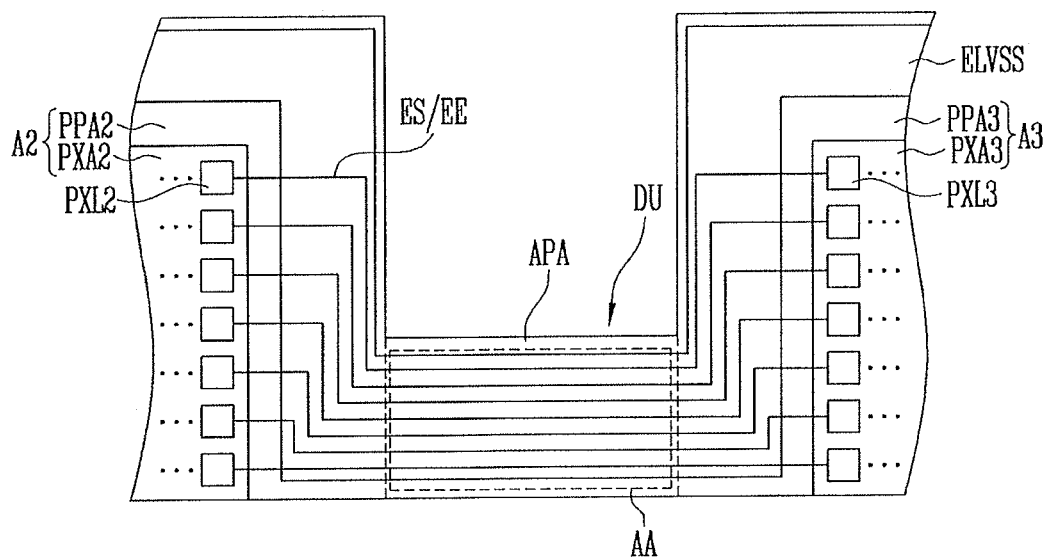
FIG. 11 and FIG. 12 illustrate plan views of a second area, a third area, and an additional peripheral area according to an embodiment of the present disclosure.
Figure 12:
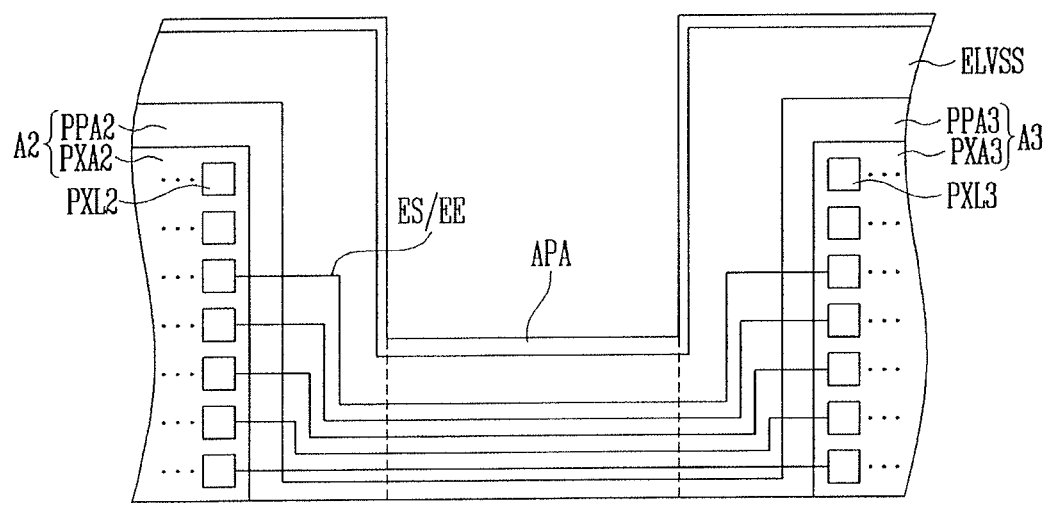
Figure 13:
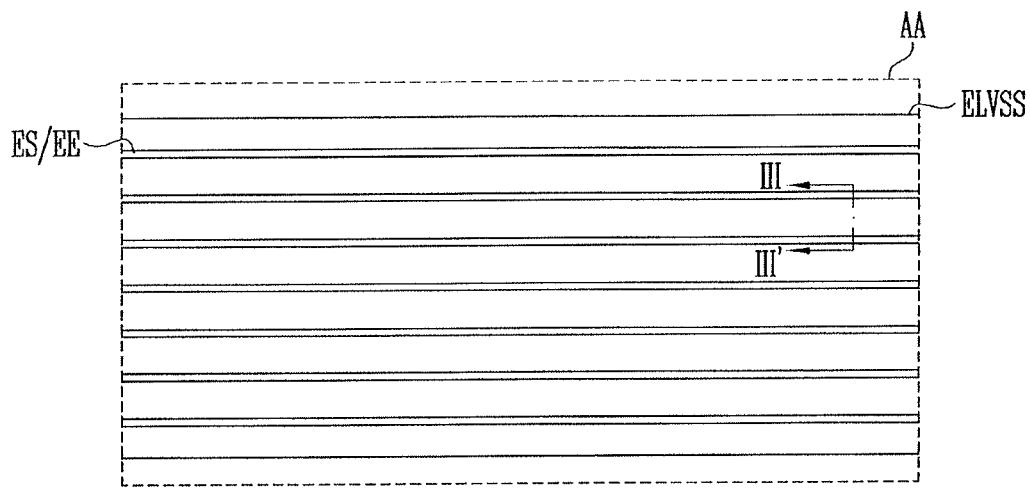
FIG. 13 illustrates an enlarged view of area AA of FIG. 12.
Figure 14:
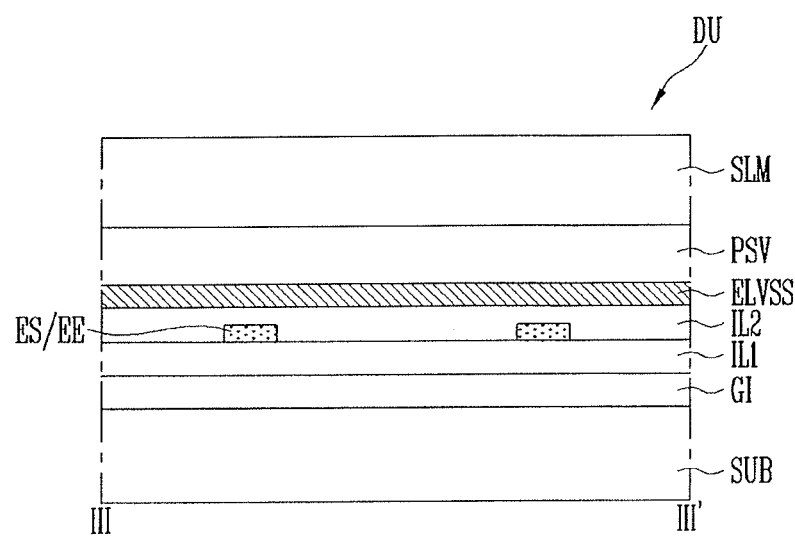
FIG. 14 illustrates a cross-sectional view taken along line III-III' of FIG. 13.

FIG. 11 and FIG. 12 are plan views illustrating a second area, a third area, and an additional peripheral area according to an embodiment of the present disclosure, FIG. 13 is an enlarged view of area AA of FIG. 12, and FIG. 14 is a cross-sectional view taken on line III-III' of FIG. 13. In FIGS. 11 to 14, only some of the configurative elements are illustrated for convenience sake.

Referring to FIGS. 8 to 14, load values of the scan lines connected to each of the second pixel PXL2 and the third pixel PXL3 of the second area A2 and the third area A3, respectively, may be different relative to the load values of the scan lies connected to the first pixel PXL1 of the first area A1. This is because the number of pixels in each of the second area A2 and the third area A3 and the length of the corresponding scan lines are different from those in the first area A1. In other words, the load value of the scan line within the first area A1 may be greater than the load value of the scan line within each of the second area A2 and the third area A3.

Accordingly, in an embodiment of the present disclosure, in order to compensate for the difference of load values between the pixel areas, parasitic capacitance of different structures may be applied to each pixel area using a dummy unit. That is, in order to compensate for the difference of load values of the scan lines in the second pixel area PXA2 and the third pixel area PXA3 relative to the load values of the scan lines in the first pixel area PXA1, a dummy unit is not provided in the first peripheral area PPA1 corresponding to the first pixel area PXA1, while the dummy unit is provided in the additional peripheral area APA that connects the second peripheral area PPA2 corresponding to the second pixel area PXA2 and the third peripheral area PPA3 corresponding to the third pixel area PXA3.

In detail, in an embodiment of the present disclosure, a dummy unit DU is defined in the additional peripheral area APA that connects the second peripheral area PPA2 and the third peripheral area PPA3, such that parasitic capacitance of the dummy unit DU compensates for the difference of load values of the scan lines in the second pixel area PXA2 and the third pixel area PXA3 relative to the load values of the scan lines in the first pixel area PXA1. That is, in the dummy unit DU, an overlap between the power source supply part and the scan line connecting parts ES with in the light emission control line connecting parts EE in the additional peripheral area APA forms a parasitic capacitor to compensate for the load values, as will be described in more detail below.

Figure 16:
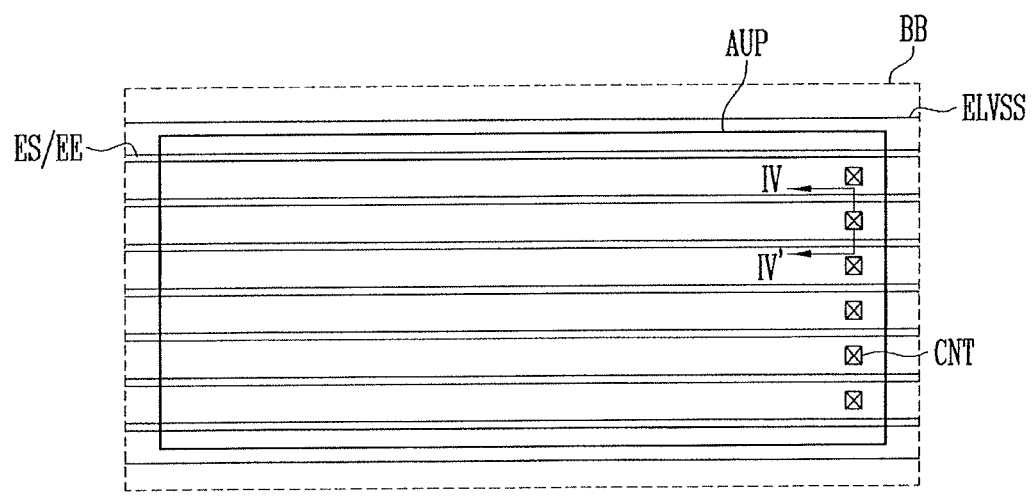
FIG. 16 illustrates an enlarged view of area BB of FIG. 15.

In the additional peripheral area APA, as illustrated in FIGS. 3 and 11, at least one scan line connecting part ES that connects the second scan lines S21, S22 of the second area A2 and the third scan line S31, S32 of the third area A3 arranged in a same row may be provided. For example, as illustrated in FIG. 11, in the additional peripheral area APA, a plurality of scan line connecting parts ES that connect each of the second scan lines S21, S22 and the third scan lines S31, S32 may be provided. Further, as illustrated in FIG. 16, in the additional peripheral area APA, the scan line connecting parts ES that connect the second scan line S21, S22 and the third scan line S31, S32 may be provided, while some of the second scan lines S21, S22 and some of the third scan lines S31, S32 are not connected to the scan line connecting parts ES. Likewise, in the additional peripheral area APA, at least one light emission control line connecting part EE for connecting the second light emission control line E21, E22 of the second area A2 and the third light emission control line E31, E32 of the third area A3 arranged in a same row may be provided.

In an embodiment of the present disclosure, the dummy unit DU may be provided in an area where the scan line connecting parts ES or the light emission control line connecting parts EE are overlapped with the power source supply part. The power source supply part may be one of the first power source supply line ELVDD and the second power source supply line ELVSS. Hereinafter, for convenience, explanation will be made based on an assumption that the dummy unit is provided in the area where the scan line connecting parts ES or the light emission control line connecting parts EE are overlapped with the second power source supply line ELVSS.

The scan line connecting parts ES and the light emission control line connecting parts EE may be made of a same material as and in a same process as the upper electrode UE of the initializing power source line IPL and the storage capacitor Cst. Therefore, the scan line connecting parts ES and the light emission control line connecting parts EE may be formed on a same layer as the initializing power source line IPL and the upper electrode UE. In an embodiment of the present disclosure, explanation is made based on an assumption that the scan line connecting parts ES and the light emission control line connecting parts EE are formed on a same layer as the initializing power source line IPL and the upper electrode UE, but there is no limitation thereto. For example, the scan line connecting parts ES and the light emission control line connecting parts EE may be formed on a same layer as the second scan lines S21, S22.

The second power source supply line ELVSS may be made of a same material as and in a same process as the connecting line CNL, the bridge pattern BRP, and the power source line PL. Therefore, the second power source supply line ELVSS may be formed on the same layer as the connecting line CNL, the bridge pattern BRP, and the power source line PL, e.g., on the second interlayer insulating film IL2. In an embodiment of the present disclosure, explanation is made based on an assumption that the second power source supply line ELVSS is formed on the same layer as the connecting line CNL, the bridge pattern BRP, and the power source line PL, but there is no limitation thereto. For example, the second power source supply line ELVSS may be formed on the same layer as the initializing power source line IPL and the upper electrode UE.

In the dummy unit DU, the overlap between the second power source supply line ELVSS and the scan line connecting parts ES form a parasitic capacitor. The parasitic capacitance of the parasitic capacitor may increase the load of the second scan line S21, S22 and the third scan line S31, S32, thereby compensating for the load values of the second scan line S21, S22 and the third scan lines S31, S32. As a result, the load values of the second scan lines S21, S22 and the third scan lines S31, S32 may be the same as or similar to the load values of the first scan lines S11 to S1n of the first pixel area PXA1. In an embodiment of the present disclosure, the parasitic capacitance formed by the dummy unit may be set differently depending on the load values of the scan lines to compensate for.

Likewise, the dummy unit DU may compensate for the load values of the second light emission control line E21, E22 of the second pixel area PXA2 and the third light emission control line E31, E32 of the third pixel area PXA3. For example, in the dummy unit DU, the second power source supply line ELVSS and the light emission control line connecting parts EE form a parasitic capacitor. The parasitic capacitance of the parasitic capacitor may increase the loads of the second light emission control line E21, E22 and the third light emission control line E31, E32, thereby compensating for the load values of the second light emission control lines E21, E22 and the third light emission control lines E31, E32. As a result, the load values of the second light emission control lines E21, E22 and the third light emission control lines E31, E32 may be the same as or similar to the load values of the first light emission control lines E11 to E1n of the first pixel area PXA1.

In an embodiment of the present disclosure, the length of the second scan lines S21, S22 or the third scan lines S31, S32 arranged in a row where the number of the second pixels PXL2 and the third pixels PXL3 arranged in the row is small may be shorter than the length of the second scan line S21, S22 or the third scan line S31, S32 arranged in a row where the number of the second pixels PXL2 and third pixels PXL3 arranged in a row where the number of the second pixels PXL2 and the third pixels PXL3 arranged in a row is big. Among the scan line connecting parts ES, the length of the scan line connecting parts ES connected to the second scan line S21, S22 or the third scan line S31, S32 that are short may be greater than the length of the scan line connecting parts ES connected to the second scan line S21, S22 or the third scan line S31, S32 that are long.

Since the dummy unit is arranged in an area where the second power source supply line ELVSS and the scan line connecting parts ES are overlapped with each other, the overlapped surface area of the scan line connecting parts ES that are long and the second power source supply line ELVSS may be greater than the overlapped surface area of the scan line connecting parts ES that are short and the second power source supply line ELVSS. The parasitic capacitance of the parasitic capacitor being formed by the superimposition of the scan line connecting parts ES that are long and the second power source supply line ELVSS may be greater than the parasitic capacitance of the parasitic capacitor formed by the superimposition of the scan line connecting parts ES that are short and the second power source supply line ELVSS.

Therefore, in the second pixel area PXA2, the load values of the second scan lines S21, S22 or the third scan line S31, S32 arranged in a row where the number of the second pixels PXL2 and the third pixels PXL3 arranged in the row is small may be the same as or similar to the load values of the second scan line S21, S22 or the third scan line S31, S32 arranged in a row where the number of the second pixels PXL2 and the third pixels PXL3 arranged in a row is big.

The parasitic capacitance may be set differently depending on the load values of the scan line connecting parts to compensate for, and the load values may be achieved by having different surface areas of superimposition of the second power source supply line ELVSS and the scan line connecting parts. Likewise, the difference of load values of the light emission control line connecting parts may also be achieved by having different surface areas of superimposition of the second power source supply line ELVSS and the light emission control line connecting parts.

Further, in the present embodiment, as illustrated in FIG. 12, the scan lines or light emission control lines of the pixel rows not connected to the scan line connecting parts ES or the light emission control line connecting parts EE may not have their load values compensated for by the dummy unit. The scan lines or the light emission control lines of the pixel rows not connected with the scan line connecting parts ES or the light emission control line connecting parts EE may have an additional dummy unit at their end to have their load values compensated for.

Figure 15:
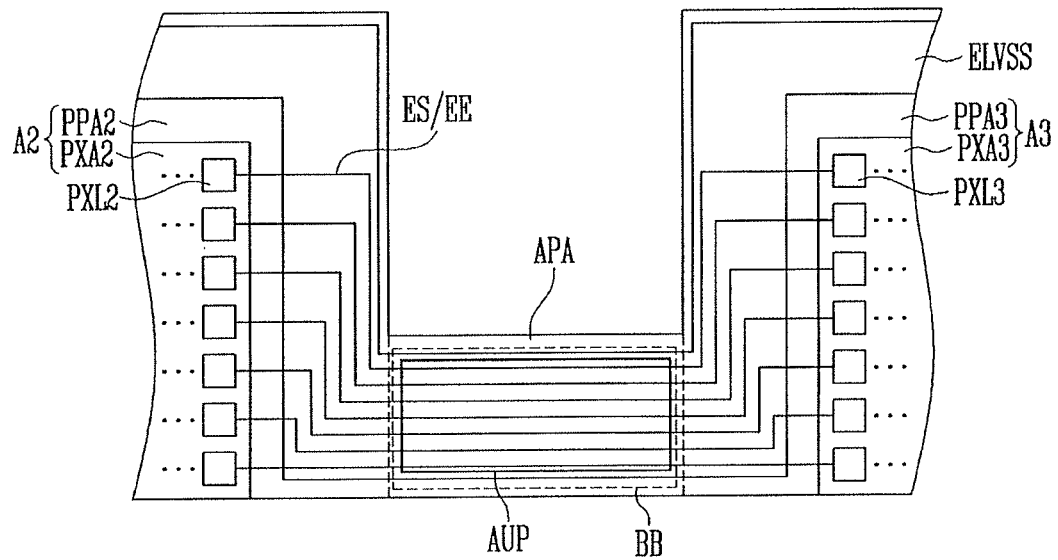
FIG. 15 illustrates a plan view of a second area, a third area, and an additional peripheral area according to an embodiment of the present disclosure.
Figure 17:
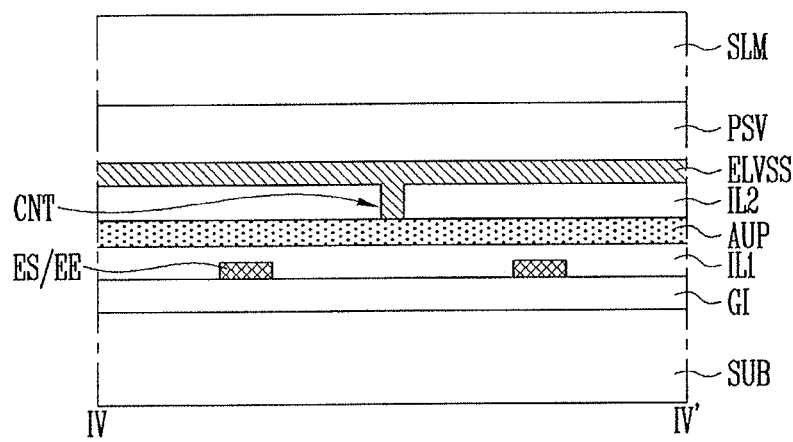
FIG. 17 illustrates a cross-sectional view taken along line IV-IV' of FIG. 16.

FIG. 15 is a plan view illustrating a second area, a third area, and an additional peripheral area according to an embodiment of the present disclosure, FIG. 16 is an enlarged view of BB area of FIG. 15, and FIG. 17 is a cross-sectional view taken on line IV-IV' of FIG. 16.

Referring to FIGS. 8 to 10 and FIGS. 15 to 17, the load values of the second pixel PXL2 and the third pixel PXL3 of the second area A2 and the third area A3 and the scan lines connected to the first pixel PXL1 of the first area A1 may be different from each other.

Accordingly, in an embodiment of the present disclosure, in order to compensate for the difference of load values between the pixel areas, parasitic capacitance of different structures may be applied to each pixel area using a dummy unit. That is, in order to compensate for the difference of load values of the scan lines between the first pixel area PXA1 and the second pixel area PXA2 and the third pixel area PXA3, a dummy unit may not be provided in the first peripheral area PPA1 corresponding to the first pixel area PXA1, while the dummy unit is provided in the additional peripheral area APA that connects the second peripheral area PPA2 that corresponds to the second pixel area PXA2 and the third peripheral area PPA3 that corresponds to the third pixel area PXA3.

In the additional peripheral area APA, at least one scan line connecting part ES that connects the second scan line S21, S22 of the second area A2 and the third scan line S31, S32 of the third area A3 arranged in the same row may be provided. Likewise, in the additional peripheral area APA, at least one light emission control line connecting part EE that connects the second light emission control line E21, E22 of the second area A2 and the third light emission control line E31, E32 of the third area A3 arranged in the same row may be provided.

In an embodiment of the present disclosure, the dummy unit may be provided in the area where the scan line connecting parts ES or the light emission control line connecting parts EE are overlapped with the power source supply part. The power source supply part may be one of the first power source supply line ELVDD and the second power source supply line ELVSS, for example, the second power source supply line ELVSS.

Further, the dummy unit may include the auxiliary power source supply pattern AUP being connected to the second power source supply line ELVSS. The auxiliary power source supply pattern AUP may be arranged between the scan line connecting parts ES or the light emission control line connecting parts EE and the second power source supply line ELVSS, and may be overlapped with the scan line connecting parts ES or the light emission control line connecting parts EE and the second power source supply line ELVSS. For example, the auxiliary power source supply pattern AUP may be made of the same material as and in the same process as the initializing power source line IPL and the upper electrode UE of the storage capacitor Cst. Therefore, the auxiliary power source supply pattern AUP may be formed on the same layer as the initializing power source line IPL and the upper electrode UE. That is, the auxiliary power source supply pattern AUP may be arranged between the first interlayer insulating film IL1 and the second interlayer insulating film IL2.

The scan line connecting parts ES and the light emission control line connecting parts EE may be made of the same material as and in the same process as the second scan line S21, S22 or the second light emission control line E21, E22. Therefore, the scan line connecting parts ES and the light emission control line connecting parts EE may be formed on the same layer as the second scan line S21, S22 or the second light emission control line E21, E22. That is, the scan line connecting parts ES and the light emission control line connecting parts EE may be arranged between the gate insulating film GI and the first interlayer insulating film IL1.

In the dummy unit, the auxiliary power source supply pattern AUP may be overlapped with the scan line connecting parts ES and the light emission control line connecting parts EE to form the parasitic capacitor.

The parasitic capacitance of the parasitic capacitor may increase the load of the second scan line S21, S22 and the third scan line S31, S32, thereby compensating the load values of the second scan line S21, S22 and the third scan line S31, S32. As a result, the load values of the second scan line S21, S22 and the third scan line S31, S32 may be the same as or similar to the load values of the first scan lines S11 to S1n of the first pixel area PXA1.

Likewise, the dummy unit may compensate for the load values of the second light emission control line E21, E22 of the second pixel area PXA2 and the third light emission control line E31, E32 of the third pixel area PXA3.

Figure 18:
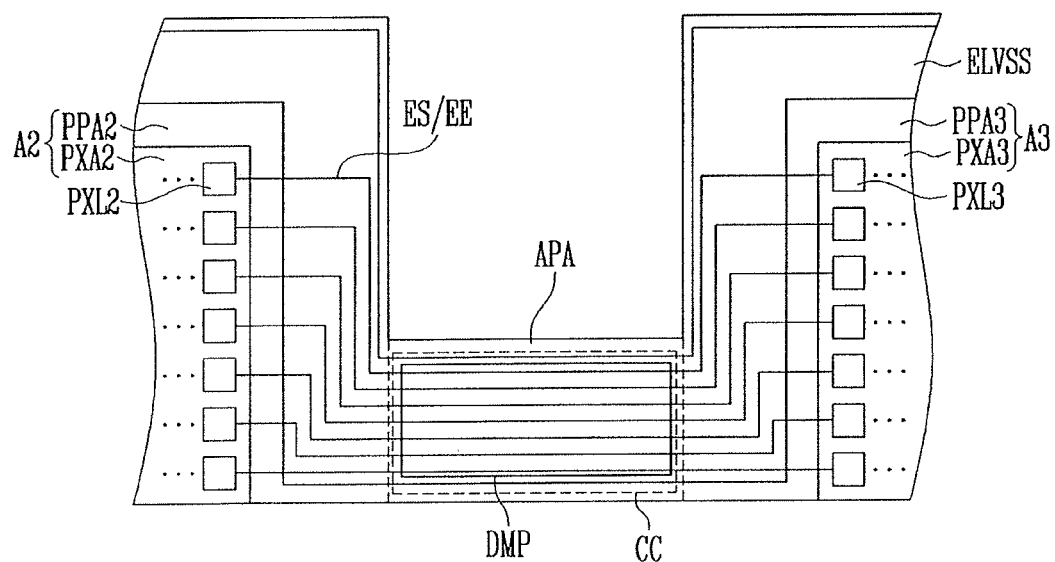
FIG. 18 illustrates a plan view of a second area, a third area, and an additional peripheral area according to an embodiment of the present disclosure.
Figure 19:
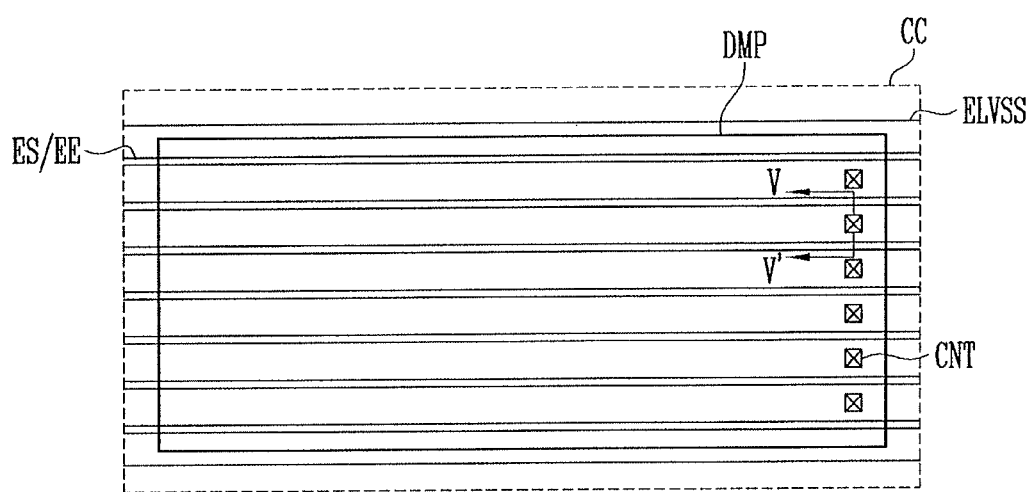
FIG. 19 illustrates an enlarged view of area CC of FIG. 18.
Figure 20:
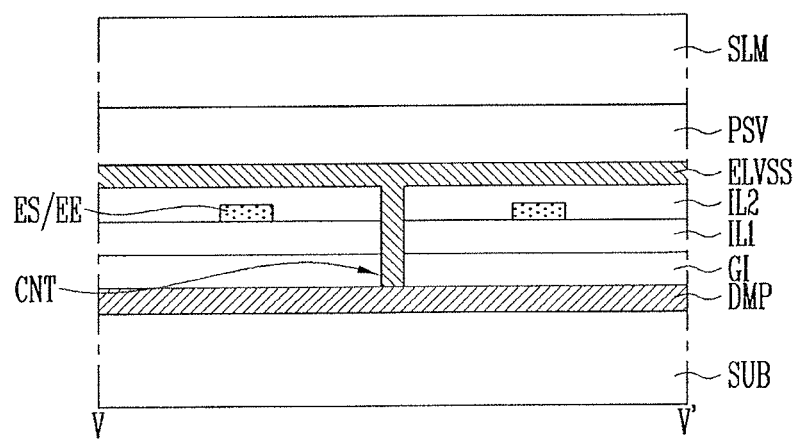
FIGS. 20 to 22 illustrate cross-sectional views taken along line V-V' of FIG. 19.
Figure 21:
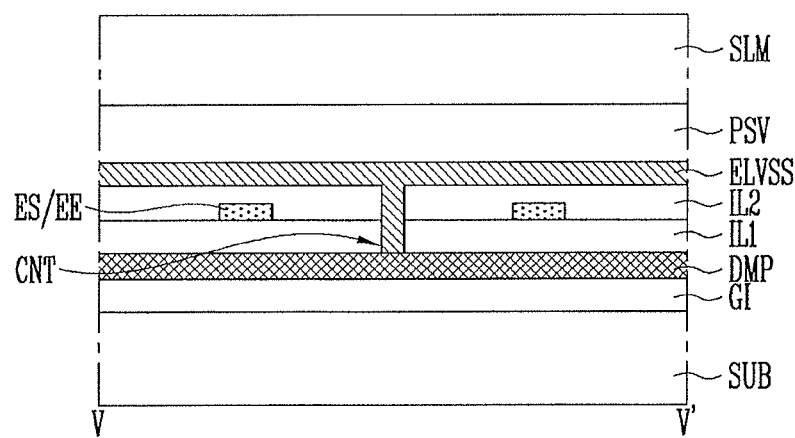
Figure 22:
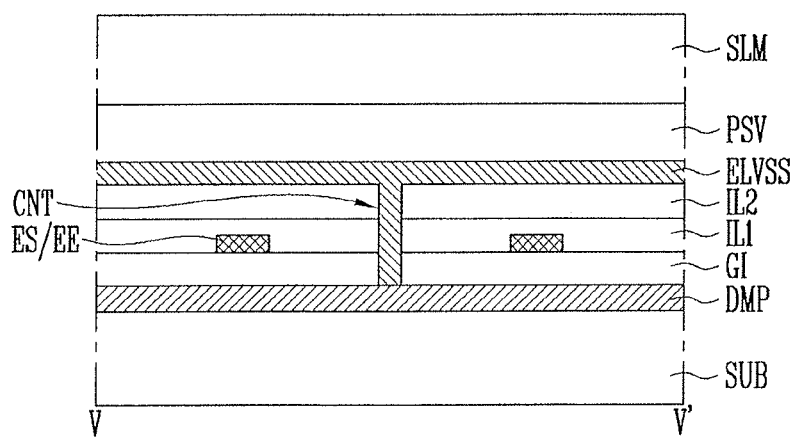

FIG. 18 is a plan view illustrating the second area, the third area and the additional peripheral area according to an embodiment of the present disclosure, FIG. 19 is an enlarged view of CC area of FIG. 18, and FIGS. 20 to 22 are cross-sectional views taken on line III-III' of FIG. 19. FIGS. 18 to 22 illustrated only some of the configurative elements for convenience of explanation.

First of all, referring to FIGS. 8 to 10 and FIGS. 18 to 20, the load values of the second pixel PXL2 and the third pixel PXL3 of the second area A2 and the third area A3 and the scan lines connected to the first pixel PXL1 of the first area A1 may be different from each other.

Accordingly, in an embodiment of the present disclosure, in order to compensate for the difference of load values by pixel area, parasitic capacitance of different structures may be applied to each pixel area using a dummy unit. That is, in order to compensate for the difference of load values of the scan lines between the first pixel area PXA1 and the second pixel area PXA2 and the third pixel area PXA3, a dummy unit may not be provided in the first peripheral area PPA1 corresponding to the first pixel area PXA1, while the dummy unit is provided in the additional peripheral area APA that connects the second peripheral area PPA2 corresponding to the second pixel area PXA2 and the third peripheral area PPA3 corresponding to the third pixel area PXA3.

In an embodiment of the present disclosure, in the additional peripheral area APA, at least one scan line connecting part ES that connects the second scan line S21, S22 of the second area A2 and the third scan line S31, S32 of the third area A3 arranged in the same row may be provided.

Likewise, in the additional peripheral area APA, at least one light emission control line connecting part EE that connects the second light emission control line E21, E22 of the second area A2 and the third light emission control line E31, E32 of the third area A3 arranged in the same row may be provided.

In an embodiment of the present disclosure, the dummy unit may be provided in the area where the scan line connecting parts ES or the light emission control line connecting parts EE are overlapped with the power source supply part. The power source supply part may be one of the first power source supply line ELVDD and the second power source supply line ELVSS, for example, the second power source supply line ELVSS.

The second power source supply line ELVSS may be made of the same material and in the same process as the connecting line CNL, the bridge pattern BRP and the power source line PL. Therefore, the second power source supply line ELVSS may be formed on the same layer as the connecting line CNL, the bridge pattern BRP and the power source line PL, for example, the second interlayer insulating film IL2.

The scan line connecting parts ES and the light emission control line connecting parts EE may be made of the same material and in the same process as the initializing power source line IPL and the upper electrode UE of the storage capacitor Cst. Therefore, the scan line connecting parts ES and the light emission control line connecting parts EE may be formed on the same layer as the initializing power source line IPL and the upper electrode UE. The second power source supply line ELVSS may be overlapped with the scan line connecting parts ES or the light emission control line connecting parts EE to form the parasitic capacitor.

Further, the dummy unit may be connected to the second power source supply line ELVSS, and may include the dummy pattern DMP that is overlapped with the second power source supply line ELVSS. The dummy pattern DMP may be made of the same material as and in the same process as the active pattern arranged in each pixel. The dummy pattern DMP may be formed on the same layer as the active pattern. That is, the dummy pattern DMP may be arranged between the substrate SUB and the gate insulating film GI, and may be formed of a semiconductor layer doped with impurities.

The dummy pattern DMP may be connected to the second power source supply line ELVSS through the contact hole CNT penetrating the gate insulating film GI, the first interlayer insulating film IL1 and the second interlayer insulating film IL2. The dummy pattern DMP may be applied with the same voltage as the second power source supply line ELVSS. Accordingly, the dummy pattern DMP may be overlapped with the scan line connecting parts ES to form the parasitic capacitor. Therefore, the dummy unit may include the parasitic capacitor formed by the scan line connecting parts ES and the second power source supply line ELV SS and the parasitic capacitor formed by the scan line connecting parts ES and the dummy pattern DMP.

The parasitic capacitance of the parasitic capacitors formed by the dummy unit may increase the loads of the second scan line S21, S22 and the third scan line S31, S32, thereby compensating for the load values of the second scan line S21, S22 and the third scan line S31, S32. As a result, the load values of the second scan line S21, S22 and the third scan line S31, S32 may be the same as or similar to the load values of the first scan lines S11 to S1n of the first pixel area PXA1.

In an embodiment of the present disclosure, the parasitic capacitance formed by the dummy unit may be set differently depending on the load values of the scan lines to compensate for.

Likewise, the dummy unit may compensate for the load values of the second light emission control line E21, E22 of the second pixel area PXA2 and the third light emission control line E31, E32 of the third pixel area PXA3. For example, the light emission control line connecting parts EE may be arranged in the additional peripheral area APA, and the second power source supply line ELVSS and the dummy pattern DMP and the light emission control line connecting parts EE may form the parasitic capacitor. The parasitic capacitance may increase the loads of the second light emission control line E21, E22 and the third light emission control line E31, E32, thereby compensating for the load values of the second light emission control line E21, E22 and the third light emission control line E31, E32. As a result, the load values of the second light emission control line E21, E22 and the third light emission control line E31, E32 may be the same as or similar to the load values of the first light emission control lines E11 to E1n of the first pixel area PXA1.

In an embodiment of the present disclosure, the dummy unit may be realized in various methods. In the aforementioned embodiment, the dummy pattern DMP arranged on the same layer as the active pattern compensates for the load values of the scan line and the light emission control line using the parasitic capacitor between the second power source supply line ELVSS and the scan line connecting parts ES and the light emission control line connecting parts EE, but there is no limitation thereto.

In an embodiment of the present disclosure, the dummy pattern DMP may be arranged on the same layer as the second scan line S21, S22. Therefore, the dummy unit may include the parasitic capacitor formed by the scan line connecting parts ES and the light emission control line connecting parts EE and the second power source supply line ELVSS, and the parasitic capacitor formed by the scan line connecting parts ES and the light emission control line connecting parts EE and the dummy pattern DMP. The dummy unit may compensate for the load values between the scan lines and the load values between the light emission control lines using the parasitic capacitors.

Next, referring to FIGS. 8 to 10, FIG. 18, FIG. 19 and FIG. 21, the second power source supply line ELVSS may be overlapped with the scan line connecting parts ES and the light emission control line connecting parts EE to form the parasitic capacitor. The scan line connecting parts ES and the light emission control line connecting parts EE may be made of the same material as and in the same process as the initializing power source line IPL and the upper electrode of the storage capacitor Cst. That is, the scan line connecting parts ES and the light emission control line connecting parts EE may be formed on the same layer as the initializing power source line IPL and the upper electrode UE.

The dummy unit may include a dummy pattern DMP that is overlapped with the scan line connecting parts ES or the light emission control line connecting parts FE. The dummy pattern DMP may be made of the same material as and in the same process as the second scan line S21, S22. Therefore, the dummy pattern DMP may include a dummy pattern DMP that is overlapped with the scan line connecting parts ES or the light emission control line connecting parts EE. The dummy pattern DMP may be made of the same material as and in the same process as the second scan line S21, S22. Therefore, the dummy pattern DMP may be formed on the same layer as the second scan line S21, S22. That is, the dummy pattern DMP may be arranged between the gate insulating film GI and the first interlayer insulting film ILL The dummy pattern DMP may be connected to the second power source supply line ELVSS through the contact hole CNT that penetrates the first interlayer insulating film IL1 and the second interlayer insulating film IL2. Therefore, the dummy pattern DMP may be applied with the same voltage as the second power source supply line ELVSS. Accordingly, the dummy pattern DMP may be overlapped with the scan line connecting parts ES to form the parasitic capacitor.

Further, the scan line connecting parts ES may form the parasitic capacitor with the second power source supply line ELVSS.

Therefore, the parasitic capacitance by the parasitic capacitors may increase the loads of the second scan line S21, S22 and the third scan line S31, S32, thereby compensating for the load values of the second scan line S21, S22 and the third scan line S31, S32. As a result, the load values of the second scan line S21, S22 and the third scan line S31, S32 may be the same as or similar to the load values of the first scan line S11 to S1n of the first pixel area PXA1.

In an embodiment of the present disclosure, the parasitic capacitance formed by the dummy unit may be set differently depending on the load values of the scan lines to compensate for.

Likewise, the dummy unit may include the parasitic capacitor formed as the dummy pattern DMP and the light emission control line connecting parts EE are overlapped with each other and the parasitic capacitor formed as the light emission control line connecting parts EE and the second power source supply line ELVSS are overlapped with each other. Therefore, the dummy unit may compensate for the load values of the second light emission control line E21, E22 of the second pixel area PXA2 and the third light emission control line E31, E32 of the third pixel area PXA3 by the parasitic capacitance of the parasitic capacitors. As a result, the load values of the second light emission control line E21, E22 and the third light emission control line E31, E32 may be the same as or similar to the load values of the first light emission control line E11 to E1n of the first pixel area PXA1.

Next, referring to FIGS. 8 to 10 and FIGS. 19 to 22, the second power source supply line ELVSS may be overlapped with the scan line connecting parts ES and the light emission control line connecting parts EE to form the parasitic capacitor.

The scan line connecting parts ES may be made of the same material as and in the same process as the second scan line S21, S22. Therefore, the scan line connecting parts ES may be formed on the same layer as the second scan line S21, S22. That is, the scan line connecting parts ES may be arranged between the gate insulating film GI and the first interlayer insulating film IL1.

The light emission control line connecting parts EE may be made of the same material as and in the same process as the second light emission control line E21, E22. Therefore, the light emission control line connecting parts EE may be formed on the same layer as the second light emission control line E21, E22. That is, the light emission control line connecting parts EE may be arranged between the first interlayer insulating film IL1 and the second interlayer insulating film IL2.

The dummy unit may be provided in the area where the scan line connecting parts ES or the light emission control line connecting parts EE area are overlapped with the second power source supply line ELVSS. The dummy unit may include the dummy pattern DMP that is overlapped with the scan line connecting parts ES or the light emission control line connecting parts EE. The dummy pattern DMP may be arranged between the substrate SUB and the gate insulating film GI, and may be formed of a semiconductor layer doped with impurities.

The dummy pattern DMP may be connected to the second power source supply line ELVSS through the contact hole CNT penetrating the gate insulating film GI, the first interlayer insulating film IL1 and the second interlayer insulating film IL2. Therefore, the dummy pattern DMP may be applied with the same voltage as the second power source supply line ELVSS. Accordingly, the dummy pattern DMP may be overlapped with the scan line connecting parts ES to form the parasitic capacitor.

The dummy unit may include the parasitic capacitor formed by the scan line connecting parts ES and the second power source supply line ELVSS and the parasitic capacitor formed by the scan line connecting parts ES and the dummy pattern DMP.

The parasitic capacitance of the parasitic capacitors being formed by the dummy unit may increase the loads of the second scan line S21, S22 and the third scan line S31, S32, thereby compensating for the load values of the second scan lines S21, S22 and the third scan lines S31, S32. As a result, the load values of the second scan line S21, S22 and the third scan line S31, S32 may be the same as or similar to the load values of the first scan line S11 to S1n of the first pixel area PXA1.

In an embodiment of the present disclosure, the parasitic capacitance being formed by the dummy unit may be set differently depending on the load values of the scan lines to compensate for.

Likewise, the dummy unit may include the parasitic capacitor being formed as the dummy pattern DMP and the light emission control line connecting parts EE are overlapped with each other and the parasitic capacitor being formed as the light emission control line connecting parts EE and the second power source supply line ELVSS are overlapped with each other. Therefore, the dummy unit may compensate for the load values of the second light emission control line E21, E22 of the second pixel area PXA2 and the third light emission control line E31, E32 of the third pixel area PXA3 by the parasitic capacitance of the parasitic capacitors. As a result, the load values of the second light emission control line E21, E22 and the third light emission control line E31, E32 may be the same as or similar to the load values of the first light emission control line E11 to E1n of the first pixel area PXA1.

Figure 23:
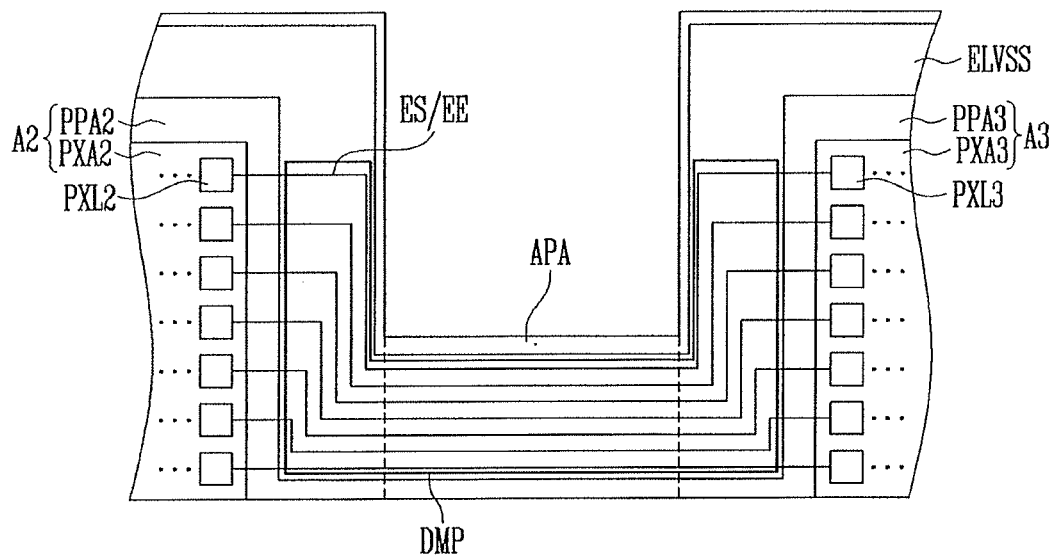
FIG. 23 illustrates a plane view of a second area, a third area, and an additional peripheral area according to an embodiment of the present disclosure.

FIG. 23 is a plan view illustrating the second area, the third area and the additional peripheral area according to an embodiment of the present disclosure.

Referring to FIG. 1A, FIG. 1B, FIGS. 2 to 10, and FIG. 23, in the right length part of the second peripheral area PPA2 and in the left length part of the third peripheral area PPA3, the scan line connecting parts ES that connect the second scan lines connected to the second pixels PXL2 of the second pixel area PXA2 and the third scan lines connected to the third pixels PXL3 of the third pixel area PXA3 may be arranged.

The length of the second scan line S21, S22 or the third scan line S31, S32 arranged in the row where the number of the second pixels PXL2 and the third pixels PXL3 arranged in the row is small may be shorter than the length of the second scan line S21, S22 or the third scan line S31, S32 arranged in the row where the number of the second pixels PXL2 and the third pixels PXL3 arranged in the row is big.

Among the scan line connecting parts ES, the length of the scan line connecting parts ES connected to the second scan line S21, S22 or the third scan line S31, S32 that are short may be greater than the length of the scan line connecting parts ES connected to the second scan line S21, S22 or the third scan line S31, S32 that are long.

The dummy unit may be provided in the area where the scan line connecting parts ES or the light emission control line connecting parts EE are overlapped with the second power source supply line ELVSS. The dummy unit may include the dummy pattern DMP that is overlapped with the scan line connecting parts ES. The dummy pattern DMP may have a shape that extends to the right length part of the second peripheral area PPA2 and to the left length part of the third peripheral area PPA3.

The dummy unit may include the parasitic capacitor formed by the scan line connecting parts ES and the second power source supply line ELVSS and the parasitic capacitor formed by the scan line connecting parts ES and the dummy pattern DMP.

Further, the surface area of superimposition of the scan line connecting parts ES that are long and the dummy pattern DMP may be greater than the surface area of superimposition of the scan line connecting parts ES that are short and the dummy pattern DMP. Therefore, the parasitic capacitance formed by the superimposition of the scan line connecting parts ES and the third dummy pattern DMP that are long may be greater than the parasitic capacitance formed by the superimposition of the scan line connecting parts ES and the third dummy pattern DMP that are short.

Therefore, in the second pixel area PXA2, the load values of the second scan line S21, S22 or the third scan line S31, S32 arranged in the row where the number of the second pixels PXL2 and the third pixels PXL3 arranged in the row is small may be the same as or similar to the load values of the second scan line S21, S22 or the third scan line S31, S32 arranged in the row where the number of the second pixels PXL2 and the third pixels PXL3 arranged in the row is big.

The parasitic capacitance may be set differently depending on the load values of the scan line connecting parts to compensate for, and the load values may be achieved by having different surface areas of superimposition for the dummy pattern and the scan line connecting part.

Likewise, the difference of load values of the light emission control line connecting parts may be achieved by having different surface areas of superimposition for the dummy pattern and the light emitting control line connecting parts.

Figure 24:
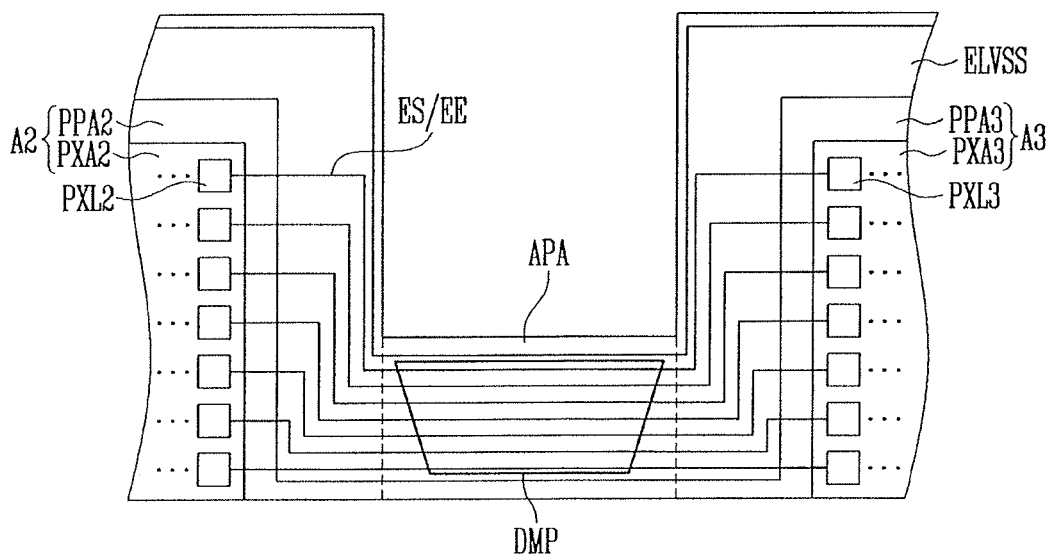
FIG. 24 illustrates a plan view of a second area, a third area, and an additional peripheral area according to an embodiment of the present disclosure.

FIG. 24 is a plan view of the second area, the third area and the additional peripheral area according to an embodiment of the present disclosure.

Referring to FIG. 1A, FIG. 1B, FIGS. 2 to 10, and FIG. 24, in the right length part of the second peripheral area PPA2, in the additional peripheral area APA and in the left length part of the third peripheral area PPA3, the scan line connecting parts ES that connect the second scan lines connected to the second pixels PLX2 of the second pixel area PXA2 and the third scan lines connected to the third pixels PXL3 of the third pixel area PXA3 may be arranged.

The length of the second scan line S21, S22 or the third scan line S31, S32 arranged in the row where the number of the second pixels PXL2 and the third pixels PXL3 arranged in the row is small may be shorter than the length of the second scan line S21, S22 or the third scan line S31, S32 arranged in the row where the number of the second pixels PXL2 and the third pixels PXL3 arranged in the row is big.

Among the scan line connecting parts ES, the length of the scan line connecting parts ES connected to the second scan line S21, S22 or the third scan line S31, S32 that are short may be greater than the length of the scan line connecting parts ES connected to the second scan line S21, S22 or the third scan line S31, S32 that are long.

The dummy unit may be provided in the area where the scan line connecting parts ES or the light emission control line connecting parts EE are overlapped with the second power source supply line ELVSS. The dummy unit may include the dummy pattern DMP that is overlapped with the scan line connecting parts ES. The dummy pattern DMP may have a shape that extends to the right length part of the second peripheral area PPA2 and to the left length part of the third peripheral area PPA3.

The dummy unit may include the parasitic capacitor formed by the scan line connecting parts ES and the second power source supply line ELVSS and the parasitic capacitor formed by the scan line connecting parts ES and the dummy pattern DMP.

In the dummy pattern DMP, among the second scan lines S21, S22, the width of the area that is overlapped with the scan line connecting parts ES connected to the scan line S21 that is shorter may be greater than the width of the area that is overlapped with the scan line connecting parts ES connected to the second scan line S22 that is longer. For example, the dummy pattern DMP may have a trapezoidal shape of which the farther it is from the first pixel area PXA1, the greater the width.

The surface area of superimposition of the scan line connecting parts ES that are long and the third dummy pattern DMP may be greater than the surface area of superimposition of the scan line connecting parts ES that are short and the third dummy pattern DMP.

The parasitic capacitance formed by the superimposition of the scan line connecting parts ES and the third dummy pattern DMP that are long may be greater than the parasitic capacitance formed by the superimposition of the scan line connecting parts ES and the third dummy pattern DMP that are short.

Therefore, in the second pixel area PXA2, the load values of the second scan line S21, S22 or the third scan line S31, S32 arranged in the row where the number of the second pixels PXL2 and the third pixels PXL3 arranged in the row is small may be the same as or similar to the load values of the second scan line S21, S22 or the third scan line S31, S32 arranged in the row where the number of the second pixels PXL2 and the third pixels PXL3 arranged in the row is big.

The parasitic capacitance may be set differently depending on the load values of the scan line connecting parts to compensate for, and the load values may be achieved by having different surface areas of superimposition for the dummy pattern and the scan line connecting part.

Likewise, the difference of load values of the light emission control line connecting parts may also be achieved by having different surface areas of superimposition for the dummy pattern and the light emission control line connecting parts.

Figure 25:
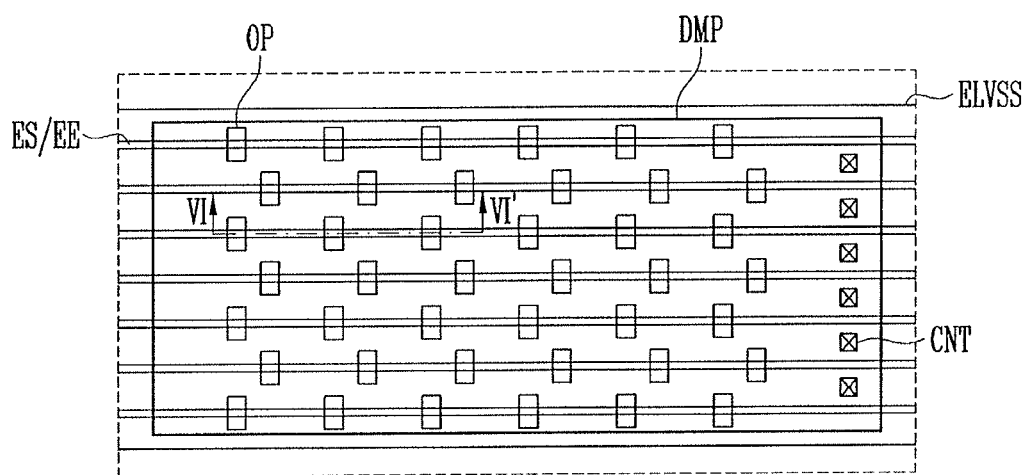
FIG. 25 illustrates a plan view of an area where a dummy unit according to an embodiment of the present disclosure is arranged.
Figure 26:
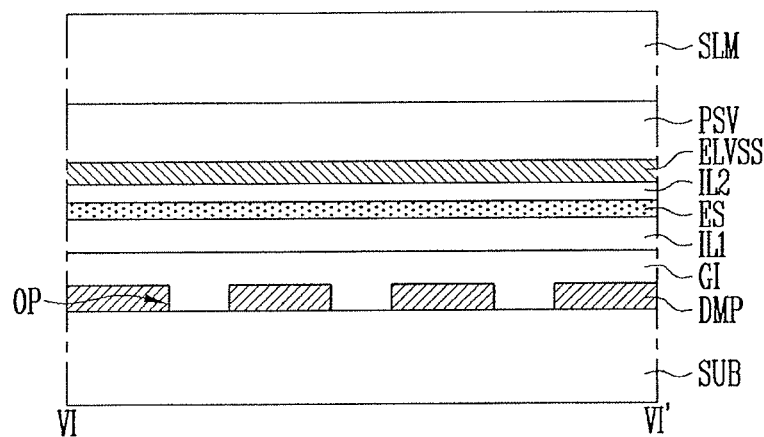
FIGS. 26 and 27 illustrate cross-sectional views along line VI-VI' of FIG. 25.
Figure 27:
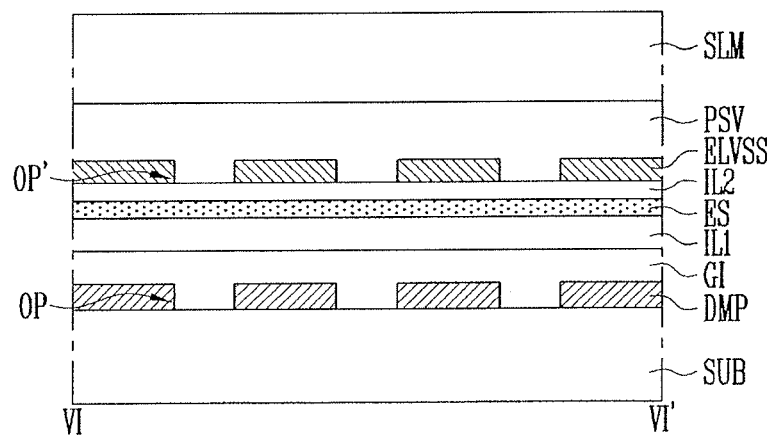

FIG. 25 is a plan view illustrating an area where the dummy unit is arranged according to an embodiment of the present disclosure, and FIGS. 26 and 27 are cross-sectional views taken on line IV-IV' of FIG. 25.

Referring to FIG. 1A, 1B, FIGS. 2 to 10, and FIGS. 25 to 27, in the second peripheral area PPA2, the second scan driver SDV2 and the second light emission driver SDV2 may be provided. Further, in the third peripheral area PPA3, the third scan driver SDV3 and the third light emission driver EDV3 may be provided.

At least one of the dummy pattern DMP and the second power source supply line ELVSS may include a plurality of open areas OP, OP' that are arranged such that they are spaced apart from each other.

The open areas OP, OP' may be overlapped with the scan line connecting parts ES or the light emission control line connecting parts EE. The scan line connecting parts ES or the light emission control line connecting parts EE may each be overlapped with at least two open areas OP, OP'.

The open areas OP, OP' may be used as a laser irradiation area for repairing when a short defect in the scan line connecting parts ES or the light emission control line connecting parts EE occurs. For example, when a short occurs in the scan line connecting parts ES or the light emission control line connecting parts EE, laser may be irradiated through the open areas OP, OP' that correspond to both sides of a point where the short occurred in the scan line connecting parts ES or the light emission control line connecting parts EE. When the laser is irradiated through the open areas OP, OP', the scan line connecting parts ES or the light emission control line connecting parts EE corresponding to those open areas OP, OP' may be disconnected. Therefore, a defect caused by a short of the scan line connecting parts ES or the light emission control line connecting parts EE may be prevented.

By way of summation and review, according to embodiments, a display device having consistent, e.g., uniform, brightness regardless of area is provided. That is, the display device may have two or more areas with different surface areas and a dummy unit overlapping lines in an area with a smaller surface area of the two or more areas, so the dummy unit compensates for a difference between load values of the lines in the two or more areas. As such, the display device provides uniform brightness in the two or more areas, regardless of surface area and lines thereon.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A display device, comprising:
   a substrate including a first pixel area, a second pixel area, and a third pixel area, each of the second and third pixel areas having a smaller surface area than the first pixel area and being connected to the first pixel area;
   first to third pixels provided in the first to third pixel areas, respectively;
   first to third lines connected to the first to third pixels, respectively;
   a line connecting part connecting the second and third lines; and
   a dummy unit overlapping the line connecting part.

2. The display device as claimed in claim 1, wherein the line connecting part is between the second pixel area and the third pixel area.

3. The display device as claimed in claim 1, wherein the first line is longer than each of the second line and the third line.

4. The display device as claimed in claim 1, wherein:
   the first line provides a scan signal or a light emitting control signal to the first pixel,
   the second line provides the scan signal or the light emitting control signal to the second pixel, and
   the third line provides the scan signal or the light emitting control signal to the third pixel.

5. The display device as claimed in claim 1, wherein:
   the substrate further comprises first to third peripheral areas surrounding the first to third pixel areas, respectively, and an additional peripheral area connecting the second peripheral area and the third peripheral area, and the dummy unit is in the additional peripheral area.

6. The display device as claimed in claim 5, wherein:

each of the second pixel and the third pixel includes a transistor having:
- an active pattern on the substrate,
- a gate electrode on the active pattern,
- a gate insulating film between the active pattern and the gate electrode,
- an interlayer insulating film including a first interlayer insulating film covering the gate electrode and a second interlayer insulating film arranged on the first interlayer insulating film, and
- a source electrode and a drain electrode arranged on the interlayer insulating film and each of which is connected to the active pattern.

7. The display device as claimed in claim 6, further comprising a power source supply line in the first peripheral area, the second peripheral area, the third peripheral area, and the additional peripheral area on the interlayer insulating film,
- wherein the power source supply line overlaps the line connecting part, and
- wherein the line connecting part is between the first interlayer insulating film and the second interlayer insulating film.

8. The display device as claimed in claim 7, wherein:
- the dummy unit includes an auxiliary power source pattern connected to the power source supply line, and arranged between the first interlayer insulating film and the second interlayer insulating film, and
- the line connecting part is between the gate insulating film and the first interlayer insulating film.

9. The display device as claimed in claim 6, wherein the dummy unit includes a dummy pattern in the additional peripheral area.

10. The display device as claimed in claim 9, further comprising a power source supply line in the first peripheral area, the second peripheral area, the third peripheral area, and the additional peripheral area,
- wherein the power source supply line is on the interlayer insulating film, and is overlapped with the line connecting part, and
- wherein the dummy pattern is applied with a same voltage as the power source supply line.

11. The display device as claimed in claim 10, wherein the dummy pattern is on a same layer as the active pattern, and includes a same material as the active pattern.

12. The display device as claimed in claim 11, further comprising a power source line to supply power to the first to third pixels, and that is electrically connected to the power source supply line,
- wherein the interlayer insulating film includes a first interlayer insulating film covering the gate electrode, and a second interlayer insulating film arranged on the first interlayer insulating film, and
- wherein the power source line and the line connecting part are arranged between the first interlayer insulating film and the second interlayer insulating film.

13. The display device as claimed in claim 11, wherein the line connecting part is on a same layer as the gate electrode, and includes a same material as the gate electrode.

14. The display device as claimed in claim 10, wherein the dummy pattern is on a same layer as the gate electrode, and includes a same material as the gate electrode.

15. The display device as claimed in claim 9, wherein each of the second pixel area and the third pixel area includes a plurality of rows where a plurality of pixels area arranged, each line connecting part connecting the second line and the third line that connect pixels arranged in a same row.

16. The display device as claimed in claim 9, wherein a length of the line connecting part is longer as a number of pixels electrically connected to the second line is smaller.

17. The display device as claimed in claim 9, wherein an area of superimposition of the line connecting part and the dummy pattern is larger as a number of pixels electrically connected to the second line is smaller.

18. The display device as claimed in claim 17, wherein the dummy pattern extends to the second peripheral area and the third peripheral area such that it is overlapped with the line connecting part.

19. The display device as claimed in claim 10, wherein at least one of the dummy pattern and the power source supply line includes a plurality of open areas that are overlapped with the line connecting part and are spaced apart from one another.

20. A display device, comprising:
- a substrate including a first pixel area, a second pixel area, a third pixel area, and a peripheral area between the second and third pixel areas;
- first to third pixels provided in the first to third pixel areas, respectively;
- first to third lines connected to the first to third pixels, respectively;
- a line connecting part connecting the second and third lines; and
- a power supply line provided in the peripheral area and overlapping the line connecting part.

* * * * *